United States Patent
Baba et al.

(10) Patent No.: US 9,324,636 B2
(45) Date of Patent: Apr. 26, 2016

(54) RESIN-SEALED SEMICONDUCTOR DEVICE AND ASSOCIATED WIRING AND SUPPORT STRUCTURE

(71) Applicant: DAI NIPPON PRINTING CO., LTD., Tokyo (JP)

(72) Inventors: Susumu Baba, Kawagoe (JP); Masachika Masuda, Tokorozawa (JP); Hiromichi Suzuki, Machida (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 0 days.

(21) Appl. No.: 14/312,132

(22) Filed: Jun. 23, 2014

(65) Prior Publication Data

US 2014/0299995 A1    Oct. 9, 2014

Related U.S. Application Data

(62) Division of application No. 13/403,616, filed on Feb. 23, 2012, now Pat. No. 8,796,832, which is a division of application No. 12/318,955, filed on Jan. 13, 2009, now Pat. No. 8,148,804.

(30) Foreign Application Priority Data

Jan. 15, 2008    (JP) .................................. 2008-005521

(51) Int. Cl.
*H01L 23/495*    (2006.01)
*H01L 23/485*    (2006.01)
(Continued)

(52) U.S. Cl.
CPC .............. *H01L 23/485* (2013.01); *H01L 23/36* (2013.01); *H01L 23/4827* (2013.01);
(Continued)

(58) Field of Classification Search
CPC ... H01L 23/485; H01L 23/4827; H01L 23/36; H01L 23/49503; H01L 23/49531; H01L 23/49816; H01L 23/49833; H01L 12/49838; H01L 24/49; H01L 2224/45147; H01L 2224/48227; H01L 2224/32225; H01L 2224/92247; H01L 2224/73265; H01L 24/48; H01L 2924/014; H01L 2924/01033; H01L 2924/01006
USPC ......... 257/763, 668, 784, 786, 675, 734, 737, 257/780, 779, 782

See application file for complete search history.

(56) References Cited

U.S. PATENT DOCUMENTS 5,293,066 A    3/1994 Tsumura
5,717,252 A *  2/1998 Nakashima et al. .......... 257/707
(Continued)

FOREIGN PATENT DOCUMENTS

JP    H08-250529 A    9/1996
JP    H11-121497 A    4/1999
(Continued)

OTHER PUBLICATIONS

Mar. 13, 2015 Office Action issued in Japanese Patent Application No. 2014-100868.
(Continued)

*Primary Examiner* — Alexander Oscar Williams
(74) *Attorney, Agent, or Firm* — Oliff PLC

(57) ABSTRACT

A wiring device for a semiconductor device, a composite wiring device for a semiconductor device and a resin-sealed semiconductor device are provided, each of which is capable of mounting thereon a semiconductor chip smaller than conventional chips and being manufactured at lower cost. The wiring device connects an electrode on a semiconductor chip with an external wiring device, and has an insulating layer, a metal substrate and a copper wiring layer. The wiring device has a semiconductor chip support portion provided on the side of the copper wiring layer with respect to the insulating layer. The copper wiring layer includes a first terminal, a second terminal and a wiring portion. The first terminal is connected with the electrode. The second terminal is connected with the external wiring device. The wiring portion connects the first terminal with the second terminal.

3 Claims, 20 Drawing Sheets

(51) Int. Cl.
*H01L 23/36* (2006.01)
*H01L 23/498* (2006.01)
*H01L 23/482* (2006.01)
*H01L 23/00* (2006.01)

(52) U.S. Cl.
CPC ... *H01L 23/49503* (2013.01); *H01L 23/49531* (2013.01); *H01L 23/49816* (2013.01); *H01L 23/49838* (2013.01); *H01L 23/49883* (2013.01); *H01L 24/49* (2013.01); *H01L 24/45* (2013.01); *H01L 24/48* (2013.01); *H01L 2224/16* (2013.01); *H01L 2224/32225* (2013.01); *H01L 2224/45144* (2013.01); *H01L 2224/45147* (2013.01); *H01L 2224/48091* (2013.01); *H01L 2224/48227* (2013.01); *H01L 2224/48237* (2013.01); *H01L 2224/49171* (2013.01); *H01L 2224/73265* (2013.01); *H01L 2224/92247* (2013.01); *H01L 2924/014* (2013.01); *H01L 2924/01004* (2013.01); *H01L 2924/01005* (2013.01); *H01L 2924/01006* (2013.01); *H01L 2924/01028* (2013.01); *H01L 2924/01029* (2013.01); *H01L 2924/01033* (2013.01); *H01L 2924/01046* (2013.01); *H01L 2924/01047* (2013.01); *H01L 2924/01078* (2013.01); *H01L 2924/01079* (2013.01); *H01L 2924/01082* (2013.01); *H01L 2924/14* (2013.01); *H01L 2924/1532* (2013.01); *H01L 2924/15311* (2013.01); *H01L 2924/19107* (2013.01)

(56) References Cited

U.S. PATENT DOCUMENTS

| | | | | |
|---|---|---|---|---|
| 6,071,755 | A | 6/2000 | Baba et al. | |
| 6,329,606 | B1 | 12/2001 | Freyman et al. | |
| 6,472,732 | B1 * | 10/2002 | Terui | 257/678 |
| 6,744,135 | B2 | 6/2004 | Hasebe et al. | |
| 7,893,546 | B2 * | 2/2011 | Zhao et al. | 257/784 |
| 8,471,371 | B2 | 6/2013 | Baba et al. | |
| 8,871,630 | B2 * | 10/2014 | Otremba et al. | 438/612 |
| 9,034,693 | B2 * | 5/2015 | Shim et al. | 438/108 |
| 2002/0190374 | A1 * | 12/2002 | Nakajima et al. | 257/707 |
| 2003/0127737 | A1 * | 7/2003 | Takahashi | 257/738 |
| 2003/0161129 | A1 * | 8/2003 | Kusano | H01L 23/4985 361/795 |
| 2005/0046035 | A1 * | 3/2005 | Egawa | H01L 23/13 257/777 |
| 2009/0008128 | A1 * | 1/2009 | Hasebe et al. | 174/252 |
| 2009/0057871 | A1 * | 3/2009 | Zhao et al. | 257/693 |
| 2009/0189263 | A1 * | 7/2009 | Baba et al. | 257/676 |
| 2011/0006410 | A1 * | 1/2011 | Baba | H01L 23/49503 257/676 |
| 2011/0012269 | A1 * | 1/2011 | Ishihara | H01L 21/568 257/774 |
| 2011/0309503 | A1 * | 12/2011 | Yamagata | 257/738 |
| 2014/0299995 | A1 * | 10/2014 | Baba et al. | 257/762 |

FOREIGN PATENT DOCUMENTS

| | | |
|---|---|---|
| JP | 2000-269376 A | 9/2000 |
| JP | 2001-127201 A | 5/2001 |
| JP | 2006-128249 A | 5/2006 |

OTHER PUBLICATIONS

Dec. 11, 2015 Office Action issued in Japanese Application No. 2014-100868.

* cited by examiner

RESIN-SEALED SEMICONDUCTOR DEVICE AND ASSOCIATED WIRING AND SUPPORT STRUCTURE

CROSS-REFERENCE TO RELATED APPLICATION

The present application is a divisional application of U.S. Ser. No. 13/403,616 (U.S. Pat. No. 8,796,832), which is a divisional of application of U.S. Ser. No. 12/318,955 (U.S. Pat. No. 8,148,804), and claims the benefit of Japanese application JP2008-005521, filed on Jan. 15, 2008, the content of which is hereby incorporated by reference into this application.

BACKGROUND OF THE INVENTION

1. Field of the Invention

The present invention relates to a wiring device for a semiconductor device, a composite wiring device for a semiconductor device, and a resin-sealed semiconductor device. The invention more particularly relates to a wiring device for a semiconductor device, a composite wiring device for a semiconductor device, and a resin-sealed semiconductor device, each of which is capable of mounting thereon a semiconductor chip smaller than conventional semiconductor chips and is manufactured at lower cost than those for manufacturing conventional ones.

2. Description of the Related Art

In recent years, semiconductor devices have been increasingly integrated and functionalized due to their higher integration densities, progress in miniaturization techniques, and the advent of highly functionalized and light and nimble electronic devices. For semiconductor devices formed at higher integration densities and having such enhanced functions, it is requested that the total number of their external terminals (pins) be increased or their terminals (pins) be made multiple.

A semiconductor package has been proposed for such semiconductor devices. The semiconductor package includes a structure in which a semiconductor chip such as an IC chip or LSI chip is mounted on a lead frame and sealed by insulating resin. As the integration density of semiconductor devices is increased and the size of the semiconductor device is reduced, the structure of the semiconductor package is also changed. As the semiconductor package, a small outline J-leaded package (SOJ) and a quad flat package (QFP) were developed. External leads for the SOJ and the QFP protrude from a side wall of a resin package to the outside of the package. After the development of the SOJ and the QFP, a quad flat non-leaded package (QFN) and a small outline non-leaded package (SON) were developed. External leads for the QFN and the SON do not protrude to the outside of the package and protrude from a back surface of a resin package. The QFN and the SON have small thicknesses and small areas in which parts are mounted.

In order to avoid problems with a mounting efficiency and mountability of the QFP, resin-sealed semiconductor devices each including a surface-mount package in which solder balls are provided as external terminals of the package have been produced in large quantities. This package of the resin-sealed semiconductor device is called a ball grid array (BGA). In addition, a semiconductor device including a surface-mount package has been developed in which external terminals are composed of flat electrodes formed in a matrix instead of solder balls of the BGA. This package is called a land grid array (LGA).

Patent Document 1: Japanese Patent No. 2688099
Patent Document 2: JP-A-10-41434

SUMMARY OF THE INVENTION

The size of a semiconductor chip has been reduced more and more. However, a reduction in a pitch between inner leads of a lead frame is limited. It is expected that it will be difficult to mount such a small semiconductor chip on the lead frame.

Such a small semiconductor device needs to undergo particular inspection after a semiconductor chip is mounted on the semiconductor device and the semiconductor device is then completed. If the semiconductor chip is defective, the semiconductor device needs to be discarded. Thus, reduction in yield of the semiconductor chips may increase the manufacturing cost of the semiconductor devices.

The present invention has been made in view of the above circumstances. It is, therefore, an object of the present invention to provide a wiring device for a semiconductor device, a composite wiring device for a semiconductor device, and a resin-sealed semiconductor device, each of which is capable of mounting thereon a semiconductor chip smaller than conventional semiconductor chips, allows the semiconductor chip to be inspected before the semiconductor device is packaged, and being manufactured at lower cost than those for manufacturing conventional ones.

According to an aspect of the present invention, a wiring device for a semiconductor device that electrically connects an electrode provided on a semiconductor chip with an external wiring device, comprises: an insulating layer; a metal substrate provided on one side of the insulating layer; a copper wiring layer provided on another side of the insulating layer; and a semiconductor chip support portion, wherein the semiconductor chip support portion is provided on the side of the copper wiring layer with respect to the insulating layer or provided on the copper wiring layer, and wherein the copper wiring layer includes a first terminal, a second terminal and a wiring portion, the first terminal being connected with the electrode provided on the semiconductor chip, the second terminal being connected with the external wiring device, the wiring portion connecting the first terminal with the second terminal.

According to another aspect of the present invention, the wiring device is provided with the metal substrate that is made of stainless.

According to still another aspect of the present invention, the wiring device is provided with the copper wiring layer that has a terminal block electrically connected with a plurality of electrodes provided on the semiconductor chip.

According to still another aspect of the present invention, a composite wiring device for a semiconductor device that electrically connects an electrode provided on a semiconductor chip with a wiring substrate, comprises a wiring device and a lead frame electrically connected with the wiring device, wherein the wiring device has an insulating layer, a metal substrate, a copper wiring layer and a semiconductor chip support portion, the metal substrate being provided on one side of the insulating layer, the copper wiring layer being provided on another side of the insulating layer, wherein the semiconductor chip support portion is provided on the side of the copper wiring layer with respect to the insulating layer or provided on the copper wiring layer, wherein the copper wiring layer includes a first terminal, a second terminal and a wiring portion, the first terminal being connected with the electrode provided on the semiconductor chip, the second terminal being connected with the lead frame, the wiring portion connecting the first terminal with the second terminal, and wherein the second terminal of the copper wiring layer is electrically connected with the lead frame by means of a second connection part.

According to still another aspect of the present invention, the composite wiring device is provided with the metal substrate that is made of stainless.

According to still another aspect of the present invention, the composite wiring device is provided with the second connection part that is made of solder.

According to still another aspect of the present invention, the composite wiring device is provided with the second connection part that is composed of a bonding wire.

According to still another aspect of the present invention, a resin-sealed semiconductor device comprises: a wiring device including an insulating layer, a metal substrate, a copper wiring layer and a semiconductor chip support portion, the metal substrate being provided on one side of the insulating layer, the semiconductor chip support portion being provided on the side of the copper wiring layer with respect to the insulating layer or provided on the copper wiring layer, the copper wiring layer being provided on another side of the insulating layer and including a first terminal, a second terminal and a wiring portion, the first terminal being connected with an electrode provided on a semiconductor chip, the second terminal being connected with an external wiring device, the wiring portion connecting the first terminal with the second terminal; a lead frame electrically connected with the wiring device; and a semiconductor chip placed above the semiconductor chip support portion of the wiring device and having an electrode, wherein the electrode provided on the semiconductor chip is electrically connected with the first terminal by means of a first connection part, wherein the second terminal is electrically connected with the lead frame by means of a second connection part, and wherein the semiconductor chip, the copper wiring layer, a part of the lead frame, the first connection part and the second connection part are resin-sealed by a resin seal member under the condition that the other part of the lead frame is exposed to the outside of the resin seal member.

According to still another aspect of the present invention, a resin-sealed semiconductor device comprises: a wiring device including an insulating layer, a metal substrate, a copper wiring layer and a semiconductor chip support portion, the metal substrate being provided on one side of the insulating layer, the semiconductor chip support portion being provided on the side of the copper wiring layer with respect to the insulating layer or provided on the copper wiring layer, the copper wiring layer being provided on another side of the insulating layer and including a first terminal, a second terminal and a wiring portion, the first terminal being connected with an electrode provided on a semiconductor chip, the second terminal being connected with an external wiring device, the wiring portion connecting the first terminal with the second terminal; and a semiconductor chip placed above the semiconductor chip support portion of the wiring device via an adhesive layer and having an electrode, wherein the electrode provided on the semiconductor chip is electrically connected with the first terminal by means of a first connection part, wherein a second connection part connected with an external part is provided on the second terminal of the copper wiring layer, and wherein the copper layer, the semiconductor chip and the first connection part are resin-sealed by a resin seal member under the condition that a part of the second connection part is exposed to the outside of the resin seal member.

According to still another aspect of the present invention, the resin-sealed semiconductor device is provided with the second connection part that is made of solder.

According to still another aspect of the present invention, the resin-sealed semiconductor device is provided with the metal substrate that is made of stainless.

According to still another aspect of the present invention, a composite wiring device for a semiconductor device that electrically connects an electrode provided on a semiconductor chip with a wiring substrate, comprises a wiring device and a lead frame electrically connected with the wiring device and mounting the wiring device thereon; wherein the wiring device includes an insulating layer, a metal substrate, a copper wiring layer, and a semiconductor chip support portion, the metal substrate being provided on one side of the insulating layer, the copper wiring layer being provided on another side of the insulating layer, wherein the semiconductor chip support portion is provided on the copper wiring layer, wherein the copper wiring layer includes a first terminal, a second terminal and a wiring portion, the first terminal being connected with the electrode provided on the semiconductor chip, the second terminal being connected with the lead frame, the wiring portion connecting the first terminal with the second terminal, wherein the second terminal of the copper wiring layer is electrically connected with the lead frame by means of a second connection part, wherein the lead frame has a die pad and a lead, the die pad mounting the wiring device thereon, the lead being located on an outer side of the die pad, and wherein the thickness of a central area of the die pad is smaller than that of the lead, the central area mounting the semiconductor chip thereon.

According to still another aspect of the present invention, the composite wiring device is provided with the metal substrate that is made of stainless.

According to still another aspect of the present invention, the composite wiring device is provided with the second connection part that is composed of a bonding wire.

According to still another aspect of the present invention, the die pad has the central area and a circumferential area, the central area mounting the semiconductor chip thereon, the circumferential area being located on an outer side of the central area and having a thickness that is substantially the same as that of the lead, the die pad having a slit hole provided between the central area and the circumferential area.

According to still another aspect of the present invention, a resin-sealed semiconductor device comprises: a wiring device including an insulating layer, a metal substrate, a copper wiring layer and a semiconductor chip support portion, the metal substrate being provided on one side of the insulating layer, the semiconductor chip support portion being provided on the copper wiring layer, the copper wiring layer being provided on another side of the insulating layer and including a first terminal, a second terminal and a wiring portion, the first terminal being connected with an electrode provided on a semiconductor chip, the second terminal being connected with an external wiring device, the wiring portion connecting the first terminal with the second terminal; a lead frame electrically connected with the wiring device and mounting the wiring device thereon; and a semiconductor chip placed above a semiconductor chip support portion of the wiring device and having an electrode, wherein the electrode provided on the semiconductor chip is electrically connected with the first terminal by means of a first connection part, wherein the second terminal is electrically connected with the lead frame by means of a second connection part, wherein the semiconductor chip, the copper wiring layer, a part of the lead frame, the first connection part and the second connection part are resin-sealed by a resin seal member under the condition that the other part of the lead frame is exposed to the outside of the resin seal member, wherein the lead frame has a die pad and a lead, the die pad mounting the wiring device thereon, the lead being located on an outer side of the die pad, and wherein the thickness of a central area of the die pad is smaller than that of the lead, the central area mounting the semiconductor chip thereon.

According to still another aspect of the present invention, the resin-sealed semiconductor device is provided with the die pad that has the central area and a circumferential area, the central area mounting the semiconductor chip thereon, the circumferential area being located on an outer side of the central area and having a thickness that is substantially the same as that of the lead, the die pad having a slit hole provided between the central area and the circumferential area.

According to still another aspect of the present invention, the resin-sealed semiconductor device is configured to ensure that a distance between a bottom surface of the die pad and a lower surface of the resin seal member is substantially the same as a distance between an upper surface of the wiring device and an upper surface of the resin seal member.

According to still another aspect of the present invention, a resin-sealed semiconductor device comprises: a wiring device including an insulating layer, a metal substrate, a copper wiring layer and a semiconductor chip support portion, the metal substrate being provided on one side of the insulating layer, the semiconductor chip support portion being provided on the copper wiring layer, the copper wiring layer being provided on another side of the insulating layer and including a first terminal, a second terminal and a wiring portion, the first terminal being connected with an electrode provided on a semiconductor chip, the second terminal being connected with an external wiring device, the wiring portion connecting the first terminal with the second terminal; and a semiconductor chip placed above the semiconductor chip support portion of the wiring device via an adhesive layer and having an electrode, wherein the electrode provided on the semiconductor chip is electrically connected with the first terminal by means of a first connection part, wherein a second connection part connected with an external part is provided on the second terminal of the copper wiring layer, wherein the copper wiring layer, the semiconductor chip and the first connection part are resin-sealed by a resin seal member under the condition that a part of the second connection part is exposed to the outside of the resin seal member, the second connection part is made of solder, and wherein the wiring portion connecting the first connection part with the second connection part surrounds the second terminal.

According to still another aspect of the present invention, the resin-sealed semiconductor device is provided with the metal substrate that is made of stainless.

As described above, according to the present invention, the semiconductor chip is electrically connected with the copper wiring layer by means of the first connection part, and the copper wiring layer is electrically connected with the lead frame by means of the second connection part. Thus, inner leads of the lead frame, which are arranged at a relatively large pitch, can be reliably connected with the electrodes provided on the semiconductor chip, which are arranged at a relatively small pitch. Therefore, the semiconductor chip, which is smaller than conventional semiconductor chips, can be mounted on the lead frame for the semiconductor device.

In addition, according to the present invention, the semiconductor chip can be inspected under the condition that the semiconductor chip is mounted on the wiring device for a semiconductor device or is mounted on the composite wiring device for a semiconductor device before the semiconductor device is packaged.

Furthermore, according to the present invention, since the copper wiring layer is provided between the first connection part and the second connection part, the cost of manufacturing the semiconductor device is lower than the cost of manufacturing a semiconductor device in which a semiconductor chip is directly connected with a lead frame by means of a bonding wire.

Furthermore, according to the present invention, since the metal substrate is made of stainless, the metal substrate has higher rigidity than those of conventional substrates made of polyimide and can be more easily handled than the conventional substrates. The thickness of the metal substrate made of stainless can be smaller than those of the conventional substrates. In addition, heat emitted by the semiconductor chip can be released from a back surface of the metal substrate.

Furthermore, according to the present invention, since the copper wiring layer has the terminal block electrically connected with the plurality of electrodes provided on the semiconductor chip, some of the electrodes, which serve as power source terminal electrodes, can be connected with the terminal block, for example. This configuration makes it possible to reduce the number of the second connection parts and reduce the total number of terminals included in the semiconductor device. In addition, the outer size of the packaged semiconductor device can be reduced compared with conventional semiconductor devices. The number of semiconductor devices packaged in the lead frame can be increased. Thus, the cost of manufacturing the semiconductor device can be reduced. In addition, the wiring device for a semiconductor device is mounted on a divided die pad slightly larger than the wiring device, and is connected with the divided die pad(s) by means of a wire(s). Thus, the divided die pad can serve as a ground block. In addition, the copper wiring layer may be provided under the semiconductor chip via an insulating film (or paste), and the die pad may be larger than the semiconductor chip, and serve as a ground layer and be connected with the wiring device by wire bonding. In this case, the number of all terminals included in the semiconductor device can be reduced.

DESCRIPTION OF THE PREFERRED EMBODIMENTS

Embodiments of the present invention are described below with reference to the accompanying drawings.

First Embodiment

Figure 1:
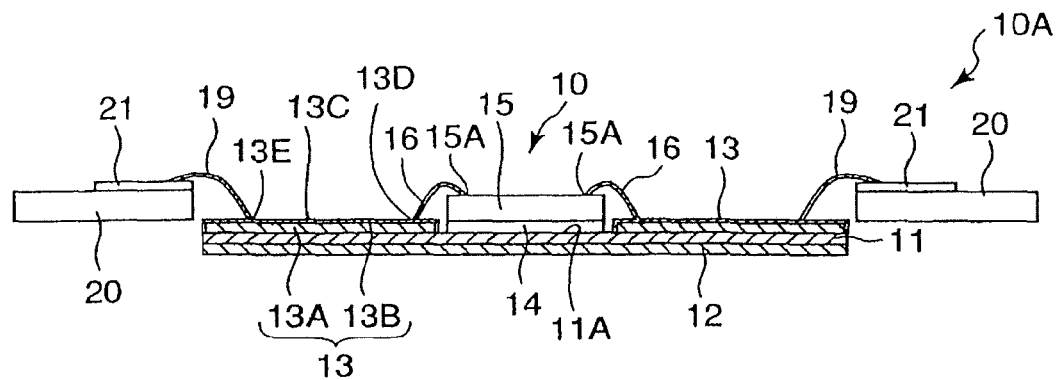
FIG. 1 is an outline cross sectional view of a semiconductor device including a wiring device (of wire connection type) for a semiconductor device according to a first embodiment of the present invention.
Figure 2:
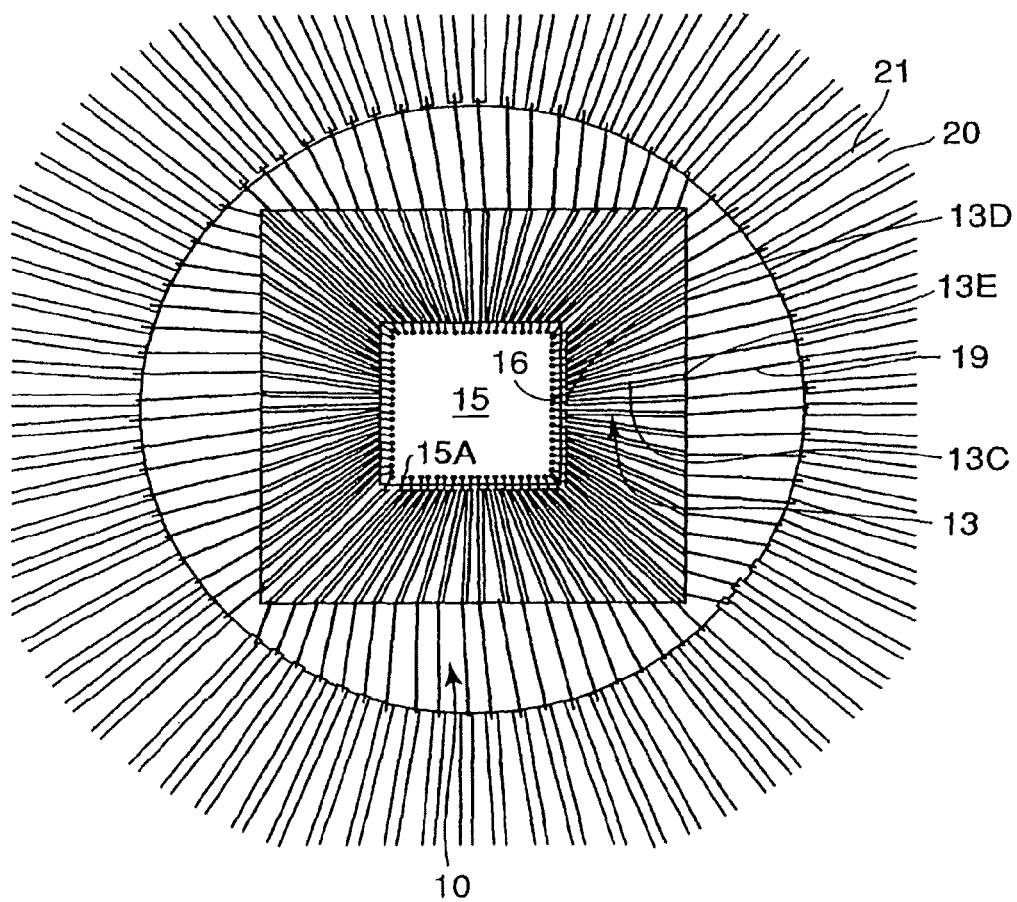
FIG. 2 is an outline plan view of the semiconductor device (shown in FIG. 1) including the wiring device according to the first embodiment.
Figure 3:
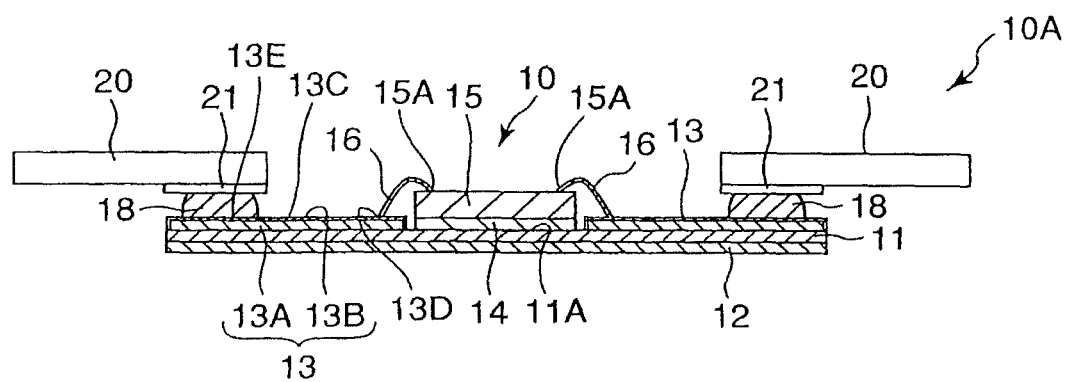
FIG. 3 is an outline cross sectional view of a semiconductor device including a wiring device (of solder connection type) for a semiconductor device according to a first modification of the first embodiment.
Figure 4:
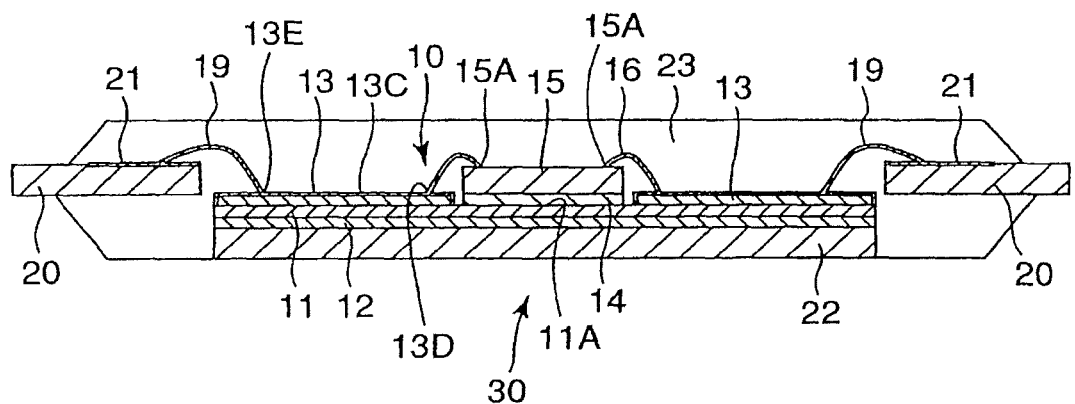
FIG. 4 is an outline cross sectional view of the semiconductor device (shown in FIG. 1) including the wiring device according to the first embodiment.
Figure 5:
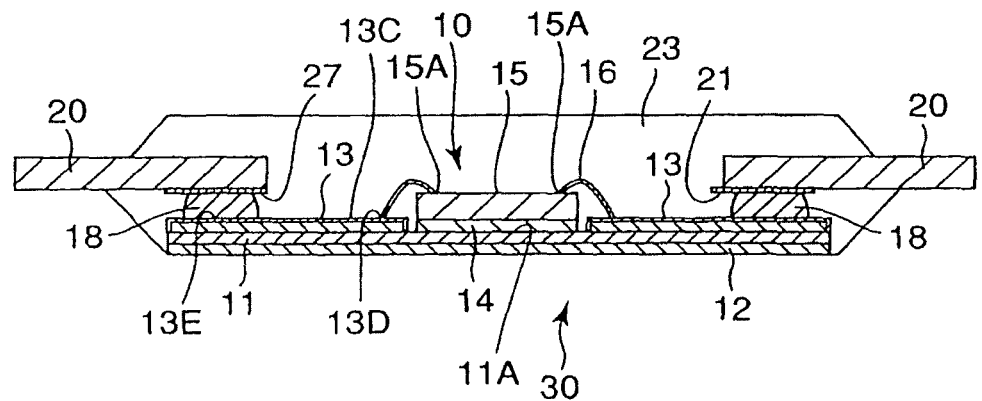
FIG. 5 is an outline cross sectional view of the semiconductor device (shown in FIG. 3) including the wiring device according to the first modification of the first embodiment.
Figure 7:
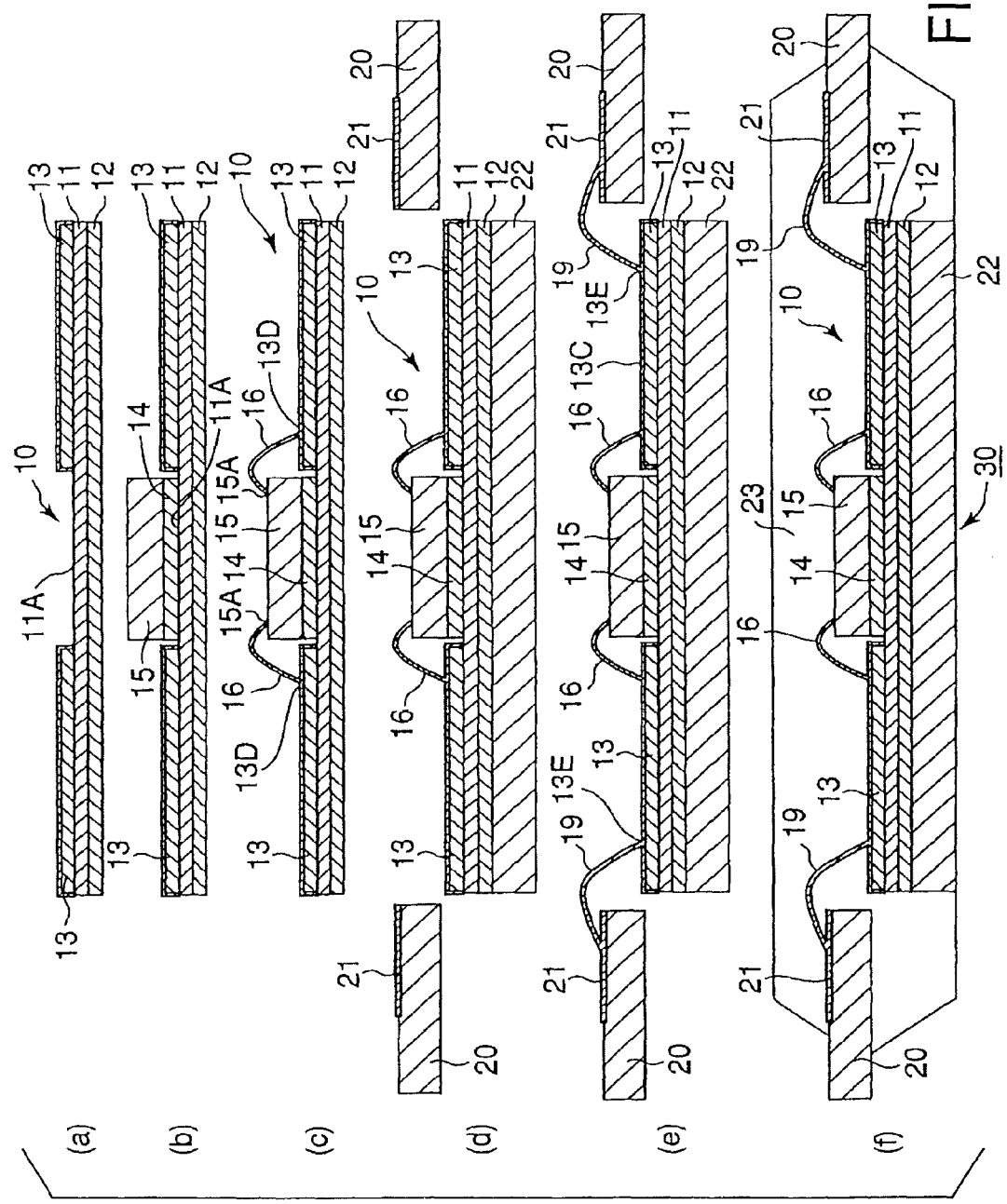
FIGS. 7(a) to 7(f) are diagrams showing a method for manufacturing the semiconductor device shown in FIG. 4.
Figure 8:
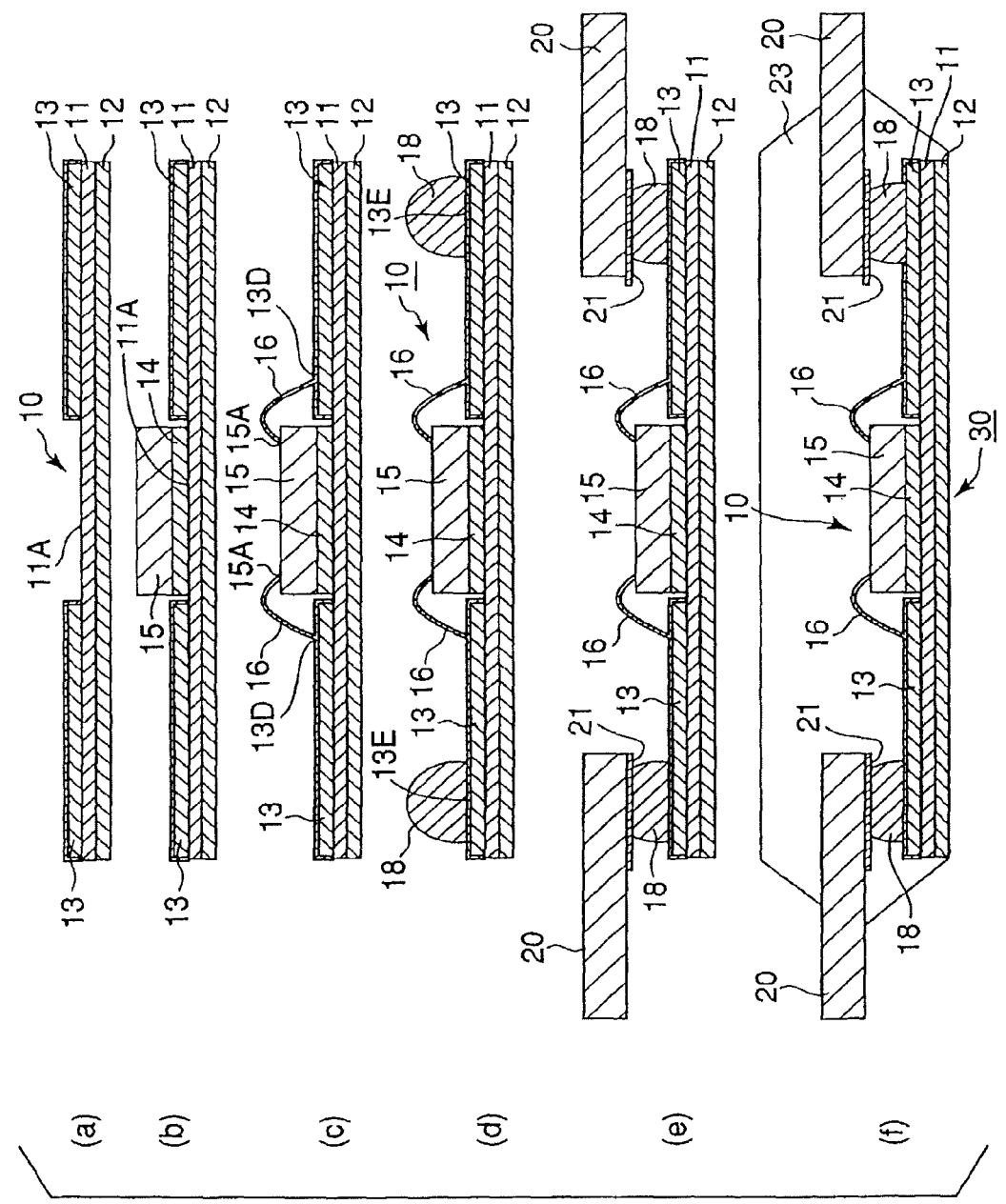
FIGS. 8(a) to 8(f) are diagrams showing a method for manufacturing the semiconductor device shown in FIG. 5.
Figure 9:
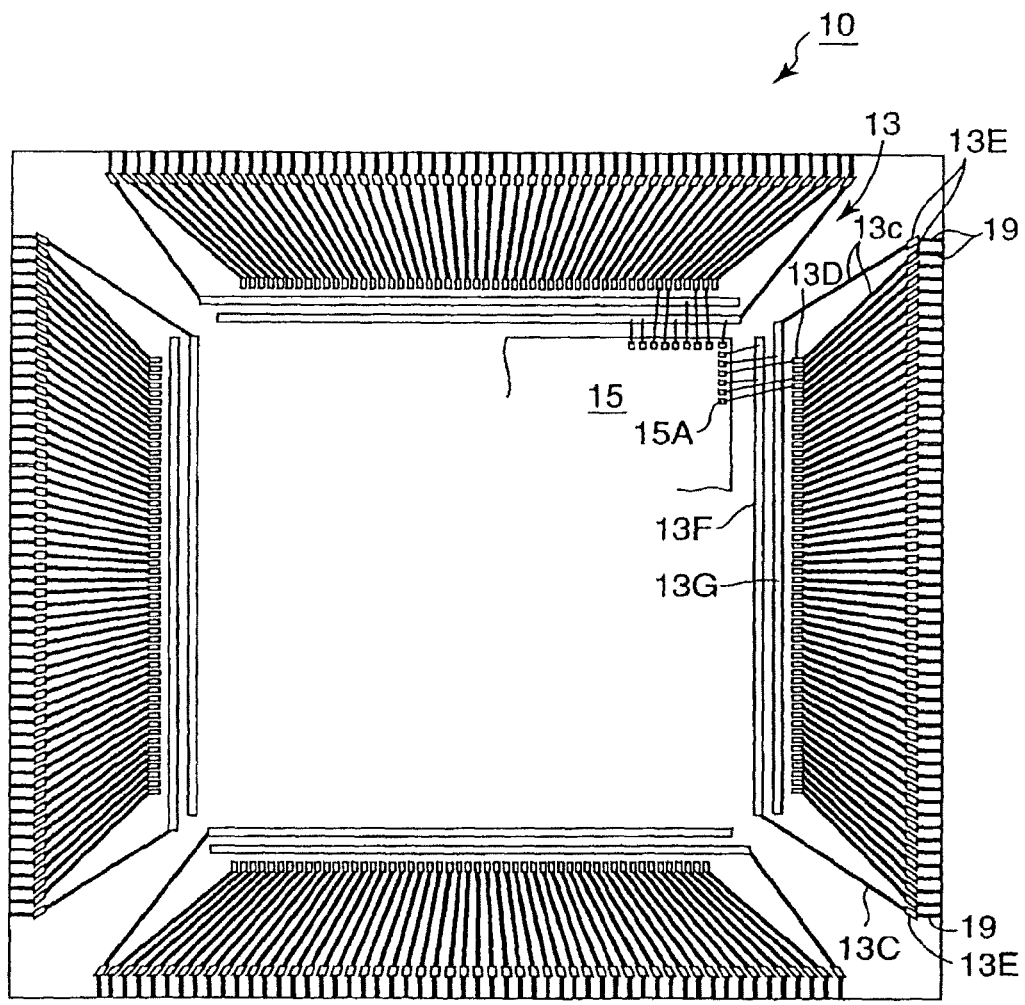
FIG. 9 is an outline plan view showing a wiring device for a semiconductor device according to a second modification of the first embodiment.
Figure 10:
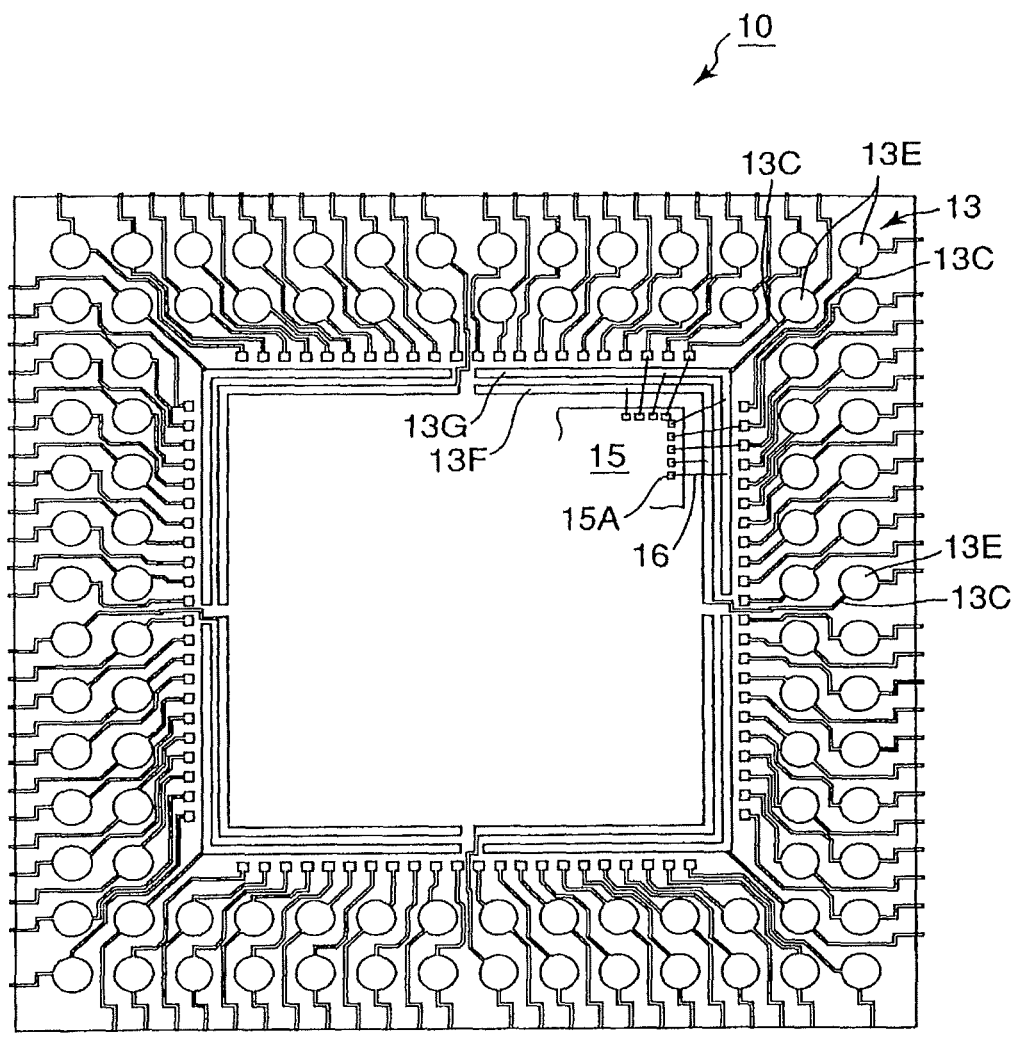
FIG. 10 is an outline plan view showing a wiring device for a semiconductor device according to a third modification of the first embodiment.

FIGS. 1 to 11 show the first embodiment of the present invention. FIG. 1 is an outline cross sectional view of a semiconductor device including a wiring device for a semiconductor device according to the first embodiment of the present invention. FIG. 2 is an outline plan view of the semiconductor device (shown in FIG. 1) including the wiring device for a semiconductor device according to the first embodiment. FIG. 3 is an outline cross sectional view of a semiconductor device including a wiring device for a semiconductor device according to a first modification of the first embodiment. FIG. 4 is an outline cross sectional view of the semiconductor device (shown in FIG. 1) including the wiring device for a semiconductor device. FIG. 5 is an outline cross sectional view of the semiconductor device (shown in FIG. 3) including the wiring device for a semiconductor device. FIGS. 6(a) to 6(d) are diagrams showing a method for manufacturing the wiring device for a semiconductor device. FIGS. 7(a) to 7(f) show a method for manufacturing the semiconductor device shown in FIG. 4. FIGS. 8(a) to 8(f) show a method for manufacturing the semiconductor device shown in FIG. 5. FIG. 9 is an outline plan view of a wiring device for a semiconductor device according to a second modification of the first embodiment of the present invention. FIG. 10 is an outline plan view of a wiring device for a semiconductor device according to a third modification of the first embodiment of the present invention. FIG. 11A is an outline plan view of a wiring device for a semiconductor device according to a fourth modification of the first embodiment of the present invention. FIG. 11B is a cross sectional view of the wiring device, taken along a line A-A of FIG. 11A. FIGS. 14(a) to 14(f) are diagrams showing a modification of the method for manufacturing the semiconductor device shown in FIG. 4. FIGS. 15(a) to 15(f) are diagrams showing a modification of the method for manufacturing the semiconductor device shown in FIG. 5.

An outline of the wiring device for a semiconductor device according to the present invention is described below with reference to FIGS. 1 to 3.

In FIG. 1, reference numeral 10 denotes the wiring device 10 for a semiconductor device according to the first embodiment. The wiring device 10 is of wire connection type. The wiring device 10 is adapted to electrically connect electrodes 15A (described later) provided on a semiconductor chip 15 with respective external wiring devices, such as, inner leads 21 included in a lead frame 20, for example.

The wiring device 10 for a semiconductor device has an insulating layer 11, a metal substrate 12 and a copper wiring layer 13. The insulating layer 11 is made of polyimide, for example. The metal substrate 12 is provided on one side of the insulating layer 11, while the copper wiring layer 13 is provided on another side of the insulating layer 11. The copper wiring layer 13 includes a plurality of first terminals 13D, a plurality of second terminals 13E, and a plurality of wiring portions 13C. The first terminals 13D are electrically connected with the respective electrodes 15A provided on the semiconductor chip 15. The second terminals 13E are electrically connected with the respective inner leads 21 (external wiring devices). The wiring portions 13C electrically connect the first terminals 13D with the second terminals 13E, respectively.

Second connection parts 19 for the lead frame 20 are provided on the respective second terminals 13E of the copper wiring layer 13. That is, the second connection parts 19 have end portions connected with the second terminals 13E and other end portions connected with the inner leads 21 (described later) of the lead frame 20, respectively. In FIGS. 1 and 2, each of the second connection parts 19 is composed of a gold bonding wire.

The wiring portions 13C of the copper wiring layer 13 radially extend from the semiconductor chip 15 as shown in FIG. 2. The copper wiring layer 13 has a copper layer 13A and a plating layer 13B (FIG. 1). The copper layer 13A is covered with the plating layer 13B. The plating layer 13B has a nickel plating layer and a gold plating layer, for example. In this case, the gold plating layer is provided on the nickel plating layer.

The metal substrate 12 may be made of one or more of metals. It is most preferable that the metal substrate 12 be made of stainless. When the metal substrate 12 is made of stainless, the metal substrate 12 has higher rigidity than that of a substrate made of another metal. The thickness of the metal substrate 12 made of stainless can be smaller than that of the substrate made of the other metal. In addition, heat emitted by the semiconductor chip 15 is transferred to the metal substrate 12 and then released from a back surface of the metal substrate 12.

The wiring device for a semiconductor device has a semiconductor chip support portion 11A. The semiconductor chip portion 11A is provided on the side of the copper wiring layer 13 with respect to the insulating layer 11. The semiconductor chip 15 has the electrodes 15A extending along the circumference of the semiconductor chip 15 as shown in FIG. 2. The semiconductor chip 15 is provided above the semiconductor chip support portion 11A via an adhesive layer 14 and thereby fixed to the semiconductor chip support portion 11A. The electrodes 15A provided on the semiconductor chip 15 are electrically connected with the first terminals 13D of the copper wiring layer 13 by means of first connection parts 16 composed of gold bonding wires, respectively.

Next, another configuration (first modification) of the wiring device 10 for a semiconductor device is described below with reference to FIG. 3. In FIG. 3, the same elements as those of the wiring device 10 shown in FIGS. 1 and 2 are denoted by the same reference numerals, and description thereof is omitted.

FIG. 3 shows a wiring device 10 for a semiconductor device. The wiring device 10 shown in FIG. 3 is of solder connection type. The wiring device 10 shown in FIG. 3 includes the insulating layer 11, the metal substrate 12 and the copper wiring layer 13. The metal substrate 12 is provided on one side of the insulating layer 11, while the copper wiring layer 13 is provided on another side of the insulating layer 11.

The semiconductor chip support portion 11A is provided on the side of the copper wiring layer 13 with respect to the insulating layer 11. The semiconductor chip 15 is provided above the semiconductor chip support portion 11A via the adhesive layer 14 and thereby fixed to the semiconductor chip support portion 11A. The first terminals 13D of the copper wiring layer 13 are electrically connected with the electrodes 15A provided on the semiconductor chip 15 by means of the first connection parts 16 composed of gold bonding wires, respectively.

In FIG. 3, second connection parts 18 for the lead frame 20 are provided on the respective second terminals 13E of the copper wiring layer 13. That is, the second connection parts 18 have bottom end portions connected with the second terminals 13E and top end portions connected with the inner leads 21 (described later) of the lead frame 20, respectively. In FIG. 3, each of the second connection parts 18 is composed of a solder connection part (solder ball).

In FIGS. 1 and 2, the wiring device 10 (for a semiconductor device), the lead frame 20, and the second connection parts 19 constitute a composite wiring device 10A for a semiconductor device. In FIG. 3, the wiring device 10 (for a semiconductor device), the lead frame 20, and the second connection parts 18 constitute a composite wiring device 10A for a semiconductor device. In FIGS. 1 and 2, the lead frame 20 is electrically connected with the wiring device 10 for a semiconductor device, and the second connection parts 19 electrically connect the second terminals 13E of the copper wiring layer 13 with the lead frame 20. In FIG. 3, the lead frame 20 is electrically connected with the wiring device 10 for a semiconductor device, and the second connection parts 18 electrically connect the second terminals 13E of the copper wiring layer 13 with the lead frame 20. Each of the composite wiring devices 10A (shown in FIGS. 1 to 3) allows the electrodes 15A provided on the semiconductor chip 15 to be electrically connected with an external wiring substrate (not shown).

The bonding wires (first connection parts 16) are used to electrically connect the electrodes 15A provided on the semiconductor chip 15 with the first terminals 13D of the copper wiring layer 13 in each of the wiring devices shown in FIGS. 1 and 3. However, metal bumps or solder balls may be used instead of the bonding wires (first connection parts 16). When the metal bumps or solder balls are used to electrically connect the electrodes 15A provided on the semiconductor chip 15 with the first terminals 13D of the copper wiring layer 13, the semiconductor chip 15 is arranged to ensure that the electrodes 15A face the respective first terminals 13D (this arrangement is not shown in the drawings). The connection method using the metal bumps and the connection method using the solder balls may be used for a semiconductor device packaged using a ball grid array (BGA) technique according to a second embodiment (described later) of the present invention.

Next, an outline of a semiconductor device having the wiring device shown in FIG. 1 is described below with reference to FIG. 4, and an outline of a semiconductor device having the wiring device shown in FIG. 3 is described below with reference to FIG. 5.

In FIG. 4, reference numeral 30 denotes the semiconductor device. The semiconductor device 30 shown in FIG. 4 includes the wiring device 10 shown in FIG. 1. Specifically, the semiconductor device 30 includes the lead frame 20, the wiring device 10, and the semiconductor chip 15. The lead frame 20 included in the semiconductor device 30 shown in FIG. 4 has a die pad 22. The wiring device 10 included in the semiconductor device 30 shown in FIG. 4 is mounted on the die pad 22 of the lead frame 20 and electrically connected with the lead frame 20. The semiconductor chip 15 included in the semiconductor device 30 shown in FIG. 4 is provided above the semiconductor chip support portion 11A of the wiring device 10 and has the electrodes 15A.

A plurality of conductive inner leads 21 are provided on an upper surface of the lead frame 20. The second connection parts 19 composed of the bonding wires electrically connect the second terminals 13E of the copper wiring layer 13 with the inner leads 21, respectively. The electrodes 15A provided on the semiconductor chip 15 are electrically connected with the first terminals 13D by means of the first connection parts 16, respectively. The semiconductor chip 15, the copper wiring layer 13, a part of the lead frame 20, the first connection parts 16 and the second connection parts 19 are resin-sealed by a resin seal member 23 under the condition that the other part of the lead frame 20 is exposed to the outside of the resin seal member 23.

In FIG. 5, reference numeral 30 denotes the semiconductor device. The semiconductor device 30 shown in FIG. 5 includes the wiring device 10 shown in FIG. 3. Specifically, the semiconductor device 30 shown in FIG. 5 includes the lead frame 20, the wiring device 10, and the semiconductor chip 15. The wiring device 10 included in the semiconductor device 30 shown in FIG. 5 is mounted on a central area of the lead frame 20 and electrically connected with the lead frame 20. The semiconductor chip 15 included in the semiconductor device 30 shown in FIG. 5 is provided above the semiconductor chip support portion 11A of the wiring device 10 and has the electrodes 15A.

A plurality of conductive inner leads 21 are provided on a lower surface of the lead frame 20. The second connection parts 18 composed of solder connection parts electrically connect the second terminals 13E of the copper wiring layer 13 with the inner leads 21, respectively. The electrodes 15A provided on the semiconductor chip 15 are electrically connected with the first terminals 13D by means of the first connection parts 16, respectively. The semiconductor chip 15, the copper wiring layer 13, a part of the lead frame 20, the first connection parts 16 and the second connection parts 18 are resin-sealed by a resin seal member 23 under the condition that the other part (referred to as "outer lead part") of the lead frame 20 is exposed to the outside of the resin seal member 23.

In FIG. 4, the wiring device 10 (shown in FIG. 1) for a semiconductor device is provided on the lead frame 20 as an example. In FIG. 5, the wiring device 10 (shown in FIG. 3) for a semiconductor device is mounted on the lead frame 20 as an example. The present invention is not limited to these examples. However, the wiring device 10 (shown in each of FIGS. 1 and 3) for a semiconductor device, or a semiconductor device (described later) shown in FIG. 12, may be provided in a built-up substrate to manufacture a thin semiconductor device.

Next, effects of the above configurations according to the present embodiment are described below.

A method for manufacturing the wiring device 10 (shown in each of FIGS. 1 and 3) for a semiconductor device is described with reference to FIGS. 6(*a*) to 6(*d*).

Figure 6:
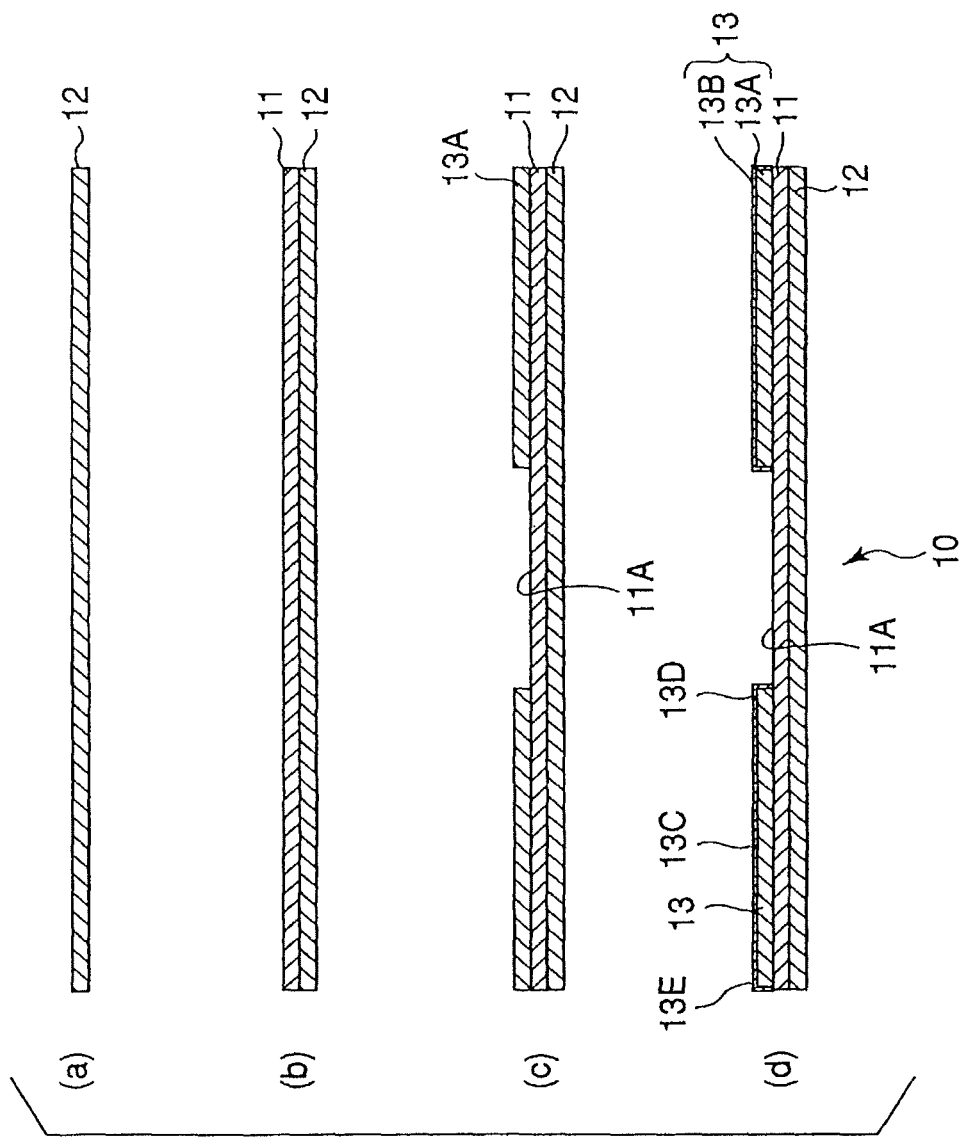
FIGS. 6(a) to 6(d) are diagrams showing a method for manufacturing the wiring device for a semiconductor device.

First, the metal substrate 12 made of stainless is prepared as shown in FIG. 6(*a*). Then, the insulating layer 11 made of polyimide is formed on the metal substrate 12 as shown in FIG. 6(*b*).

After that, the copper layer 13A is formed on the insulating layer 11 by an additive method or an etching method as shown in FIG. 6(*c*). Then, the plating layer 13B composed of, for example, a nickel plating layer and a gold plating layer is formed on the copper layer 13A by electrolytic plating or electroless plating as shown in FIG. 6(*d*). The copper layer 13A and the plating layer 13B constitute the copper wiring layer 13. The first terminals 13D, the second terminals 13E and the wiring portions 13C are formed in the process for forming the plating layer 13B. In this way, the wiring device 10 for a semiconductor device and having the insulating layer 11, the metal substrate 12 and the copper wiring layer 13 is formed.

Next, a method for manufacturing the semiconductor device (shown in FIG. 4) having the wiring device 10 of wire connection type is described below with reference to FIGS. 7(*a*) to 7(*f*).

First, the wiring device 10 for a semiconductor device is formed according to the process shown in FIGS. 6(*a*) to 6(*d*), as shown in FIG. 7(*a*). Then, the semiconductor chip 15 is placed above the semiconductor chip support portion 11A of the wiring device 10 via the adhesive layer 14 and thereby fixed to the semiconductor chip support portion 11A as shown in FIG. 7(*b*). Then, the electrodes 15A provided on the semiconductor chip 15 are connected with the first terminals 13D of the copper wiring layer 13 by means of the first connection parts 16 composed of the bonding wires, respectively, as shown in FIG. 7(*c*).

Next, the lead frame 20 including the inner leads 21 and the die pad 22 is prepared, and the wiring device 10 is mounted on the die pad 22 of the lead frame 20 as shown in FIG. 7(*d*).

Then, the second terminals 13E of the copper wiring layer 13 are connected with the inner leads 21 of the lead frame 20 by means of the second connection parts 19 composed of the bonding wires, respectively, as shown in FIG. 7(*e*). After that, the wiring device 10, the semiconductor chip 15, the first connection parts 16, the die pad 22, the second connection parts 19, and the inner leads 21 are resin-sealed by the resin seal member 23 under the condition that the part (outer lead part) of the lead frame 20 is exposed to the outside of the resin seal member 23. In this way, the semiconductor device 30 shown in FIG. 4 is completed as shown in FIG. 7(*f*).

Next, a modification of the method for manufacturing the semiconductor device (shown in FIG. 4) having the wiring device of wire connection type is described below with reference to FIGS. 14(*a*) to 14(*f*).

Figure 14:
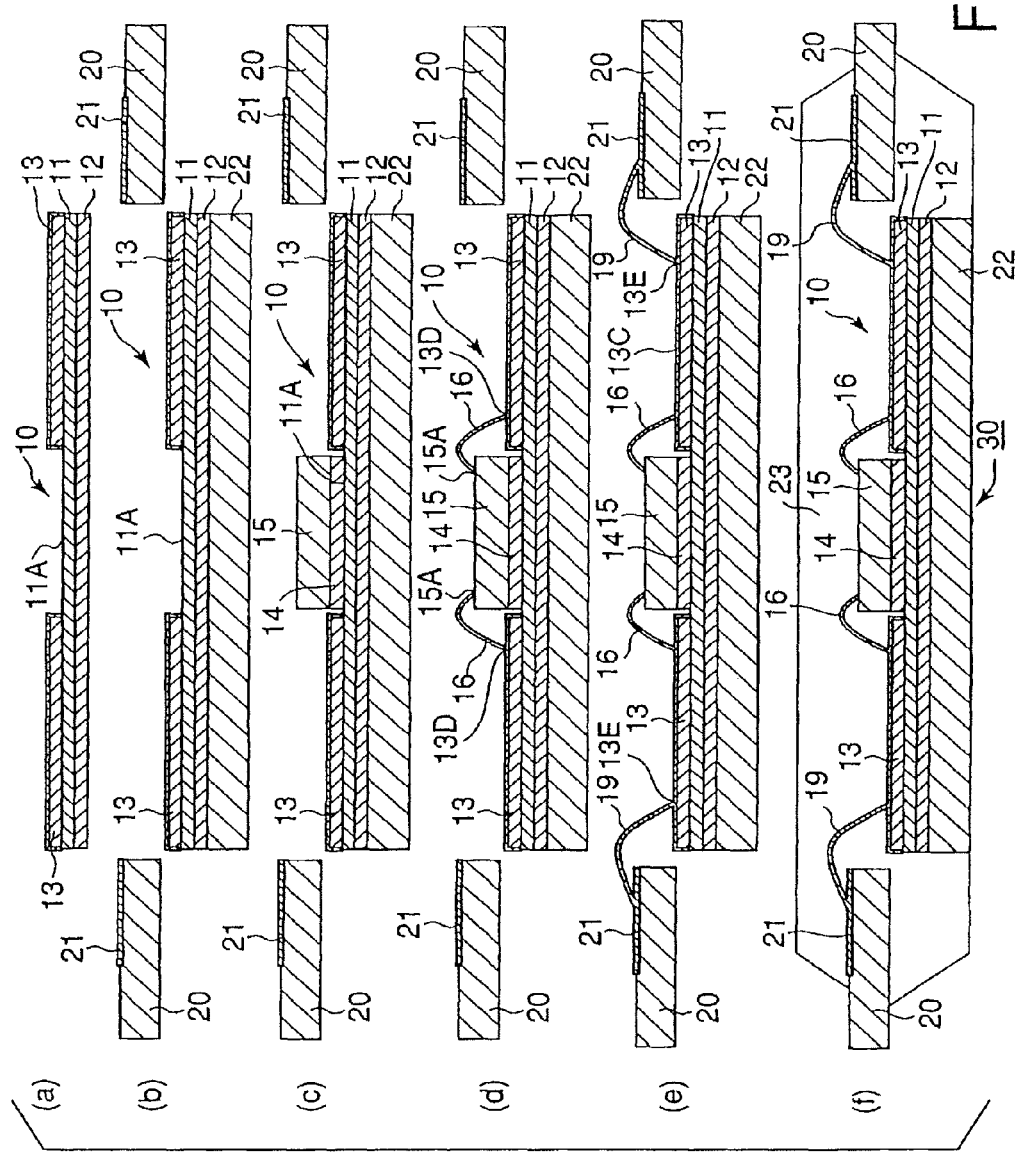
FIGS. 14(a) to 14(f) are diagrams showing a modification of the method for manufacturing the semiconductor device shown in FIG. 4.

The wiring device 10 for a semiconductor device is formed according to the process shown in FIGS. 6(*a*) to 6(*d*), as shown in FIG. 14(*a*). Then, the lead frame 20 including the inner leads 21 and the die pad 22 is prepared, and the wiring device 10 is mounted on the die pad 22 of the lead frame 20 as shown in FIG. 14(*b*).

Then, the semiconductor chip 15 is placed above the semiconductor chip support portion 11A of the wiring device 10 for a semiconductor device via the adhesive layer 14 and is thereby fixed to the semiconductor chip support portion 11A as shown in FIG. 14(*c*). The electrodes 15A provided on the semiconductor chip 15 are connected with the first terminals 13D of the copper wiring layer 13 by means of the first connection parts 16 composed of the bonding wires, respectively, as shown in FIG. 14(*d*).

Next, the second terminals 13E of the copper wiring layer 13 are connected with the inner leads 21 of the lead frame 20 by means of the second connection parts 19 composed of the bonding wires, respectively, as shown in FIG. 14(*e*). After that, the wiring device 10, the semiconductor chip 15, the first connection parts 16, the die pad 22, the second connection parts 19, and the inner leads 21 are resin-sealed by the resin seal member 23 under the condition that the part (outer lead part) of the lead frame 20 is exposed to the outside of the resin seal member 23. In this way, the semiconductor device 30 shown in FIG. 4 is completed as shown in FIG. 14(*f*).

Next, a method for manufacturing the semiconductor device (shown in FIG. 5) having the wiring device of solder connection type is described below with reference to FIGS. 8(*a*) to 8(*f*).

First, the wiring device 10 for a semiconductor device is formed according to the process shown in FIGS. 6(*a*) to 6(*d*), as shown in FIG. 8(*a*). Then, the semiconductor chip 15 is placed above the semiconductor chip support portion 11A of the wiring device 10 for a semiconductor device via the adhesive layer 14 and is thereby fixed to the semiconductor chip support portion 11A as shown in FIG. 8(*b*). The electrodes 15A provided on the semiconductor chip 15 are connected with the first terminals 13D of the copper wiring layer 13 by means of the first connection parts 16 composed of the bonding wires, respectively, as shown in FIG. 8(*c*).

Next, the second connection parts 18 for the lead frame 20 and composed of the solder connection parts (solder balls) are formed on the second terminals 13E of the copper wiring layer 13, respectively, as shown in FIG. 8(*d*).

Then, the lead frame 20 is prepared, and the second connection parts 18 are connected with the respective inner leads 21 of the lead frame 20 as shown in FIG. 8(*e*). After that, the wiring device 10, the semiconductor chip 15, the first connection parts 16, the second connection parts 18 and the inner leads 21 are resin-sealed by the resin seal member 23 under the condition that the part (outer lead part) of the lead frame 20 is exposed to the outside of the resin seal member 23. In this way, the semiconductor device 30 shown in FIG. 5 is completed as shown in FIG. 8(f).

Next, a modification of the method for manufacturing the semiconductor device (shown in FIG. 5) having the wiring device of solder connection type is described with reference to FIGS. 15(a) to 15(f).

Figure 15:
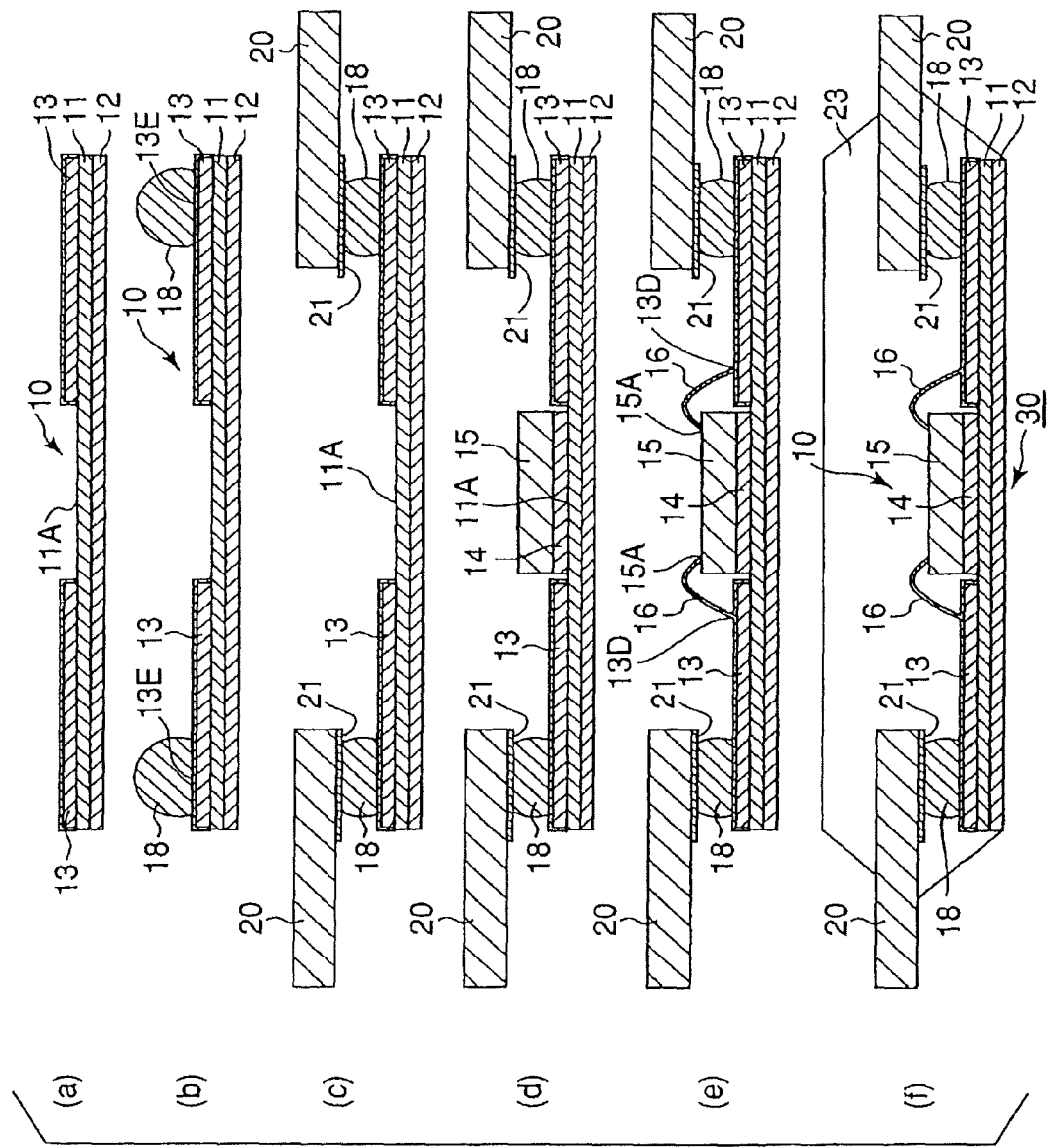
FIGS. 15(a) to 15(f) are diagrams showing a modification of the method for manufacturing the semiconductor device shown in FIG. 5.

First, the wiring device 10 for a semiconductor device is formed according to the process shown in FIGS. 6(a) to 6(d), as shown in FIG. 15(a). Then, the second connection parts 18 for the lead frame 20 and composed of the solder connection parts (solder balls) are formed on the second terminals 13E of the copper wiring layer 13 included in the wiring device 10 for a semiconductor device as shown in FIG. 15(b). Next, the lead frame 20 is prepared, and the second connection parts 18 are connected with the respective inner leads 21 of the lead frame 20 as shown in FIG. 15(c).

Then, the semiconductor chip 15 is placed above the semiconductor chip support portion 11A of the wiring device 10 for a semiconductor device via the adhesive layer 14 and is thereby fixed to the semiconductor chip support portion 11A as shown in FIG. 15(d). The electrodes 15A provided on the semiconductor chip 15 are connected with the first terminals 13D of the copper wiring layer 13 by means of the first connection parts 16 composed of the bonding wires, respectively, as shown in FIG. 15(e).

After that, the wiring device 10, the semiconductor chip 15, the first connection parts 16, the second connection parts 18 and the inner leads 21 are resin-sealed by the resin seal member 23 under the condition that the part (outer lead part) of the lead frame 20 is exposed to the outside of the resin seal member 23. In this way, the semiconductor device 30 shown in FIG. 5 is completed as shown in FIG. 15(f).

According to the present embodiment, the semiconductor chip 15, which is formed at a higher density than those of conventional semiconductor chips and is therefore smaller than the conventional semiconductor chips, can be placed above the lead frame 20. That is, pitches between the inner leads 21 of the lead frame 20 are relatively large (e.g., 130 µm), and pitches between the electrodes 15A provided on the semiconductor chip 15 are relatively small (e.g., 40 µm). Even in this case, the electrodes 15A provided on the semiconductor chip 15 are connected with the first terminals 13D of the copper wiring layer 13 by means of the first connection parts 16, respectively, according to the present embodiment. In addition, the second terminals 13E of the copper wiring layer 13 are connected with the inner leads 21 of the lead frame 20 by means of the second connection parts 18 or 19, respectively, according to the present embodiment. Therefore, the semiconductor chip 15 can be reliably electrically connected with the lead frame 20.

As a comparative example, the electrodes 15A provided on the semiconductor chip 15 are directly connected with the inner leads 21 of the lead frame 20 by means of gold bonding wires. In this comparative example, however, the lengths of the gold bonding wires are relatively large. This increases the cost of manufacturing a semiconductor device. According to the present embodiment, since the copper wiring layer 13 is placed between the first connection terminals 16 and the second connection terminals 18 or 19, the cost of manufacturing the semiconductor device 30 is lower than the cost of manufacturing a semiconductor device (according to the comparative example) in which the electrodes 15A provided on the semiconductor chip 15 are directly connected with the inner leads 21 of the lead frame 20 by means of gold bonding wires.

According to the present embodiment, the semiconductor chip 15 can be inspected under the condition that the semiconductor chip 15 is mounted above the wiring device 10 for a semiconductor device before the semiconductor device 30 is packaged.

According to the present embodiment, since the metal substrate 12 is made of stainless, the metal substrate 12 has higher rigidity than those of conventional substrates made of polyimide and can be more easily handled than the conventional substrates. In addition, the thickness of the metal substrate 12 can be smaller than those of the conventional substrates. Furthermore, the heat emitted by the semiconductor chip 15 is transferred to the metal substrate 12 and then released from the back surface of the metal substrate 12.

Next, other configurations of the wiring device 10 for a semiconductor device are described below with reference to FIGS. 9 to 11B (showing the second to fourth modifications). In FIGS. 9 to 11B, the same elements as those of the wiring device 10 for a semiconductor device shown in FIGS. 1 to 3 are denoted by the same reference numerals, and detail description thereof is omitted.

In FIG. 9 (showing the second modification), a copper wiring layer 13 has a power source terminal block 13F, a ground terminal block 13G, first terminals 13D and second terminals 13E. The power source terminal block 13F is electrically connected with a plurality of power source terminal electrodes 15A via first connection parts 16. The power source terminal electrodes 15A are provided on the semiconductor chip 15. The ground terminal block 13G is electrically connected with a plurality of ground terminal electrodes 15A via other first connection parts 16. The ground terminal electrodes 15A are provided on the semiconductor chip 15. The first terminals 13D are connected with other first connection parts 16, respectively. The second terminals 13E have rectangular shapes and are connected with second connection parts 19, respectively. Wiring portions 13C are provided between the first terminals 13D and the second terminals 13E, respectively; a wiring portion 13C is provided between the power source terminal block 13F and one of the second terminals 13E; and a wiring portion 13C is provided between the ground terminal block 13G and one of the second terminals 13E.

In FIG. 10 (showing the third modification), a copper wiring layer 13 has a power source terminal block 13F, a ground terminal block 13G, first terminals 13D and second terminals 13E. The power source terminal block 13F is electrically connected with a plurality of power source terminal electrodes 15A via first connection parts 16. The power source terminal electrodes 15A are provided on the semiconductor chip 15. The ground terminal block 13G is electrically connected with a plurality of ground terminal electrodes 15A via other first connection parts 16. The ground terminal electrodes 15A are provided on the semiconductor chip 15. The first terminals 13D are connected with other first connection parts 16, respectively. The second terminals 13E have circular shapes and are connected with second connection parts 18, respectively. Wiring portions 13C are provided between the first terminals 13D and the second terminals 13E, respectively; a wiring portion 13C is provided between the power source terminal block 13F and one of the second terminals 13E; and a wiring portion 13C is provided between the ground terminal block 13G and one of the second terminals 13E. In FIG. 10 (showing the third modification), the wires (wiring portions 13C) and leader lines, which are connected with the second terminals 13E, have crank shapes in order to prevent solder from flowing during a process for forming solder balls.

As shown in FIGS. 9 and 10, the power source terminal blocks 13F is electrically connected with the power source terminal electrodes 15A, and the ground terminal blocks 13G is electrically connected with the ground terminal electrodes 15A. These configurations make it possible to reduce the number of the second connection parts 18 and the number of the second connection parts 19.

Figure 11A:
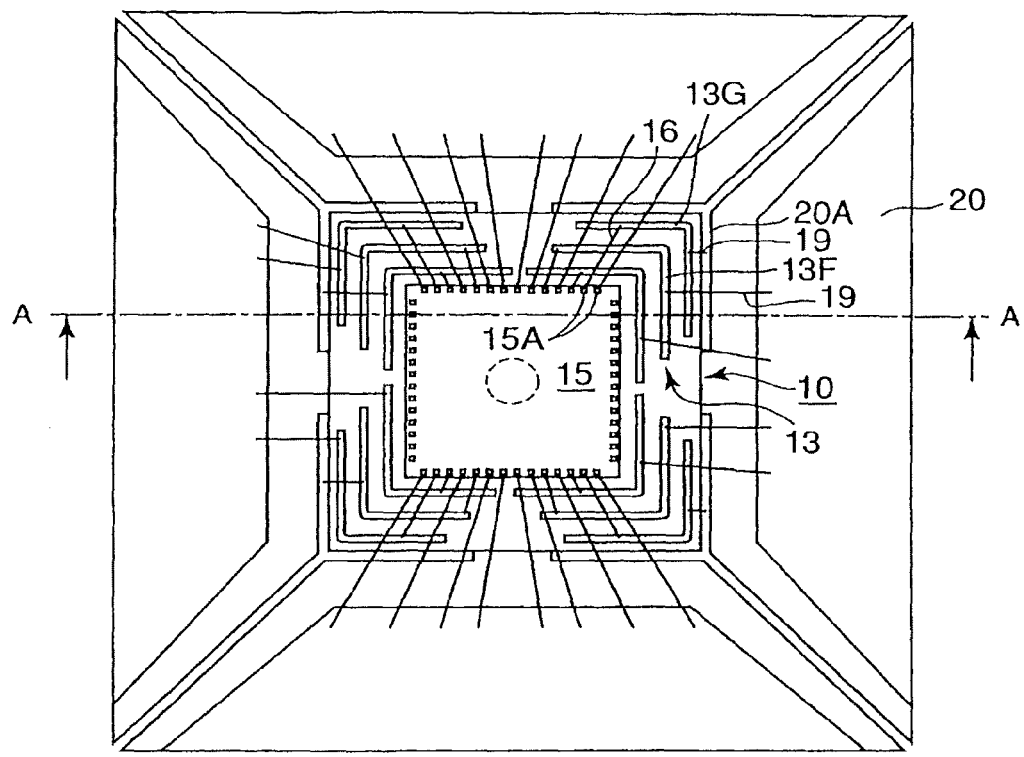
FIG. 11A is an outline plan view showing a wiring device for a semiconductor device according to a fourth modification of the first embodiment.
Figure 11B:
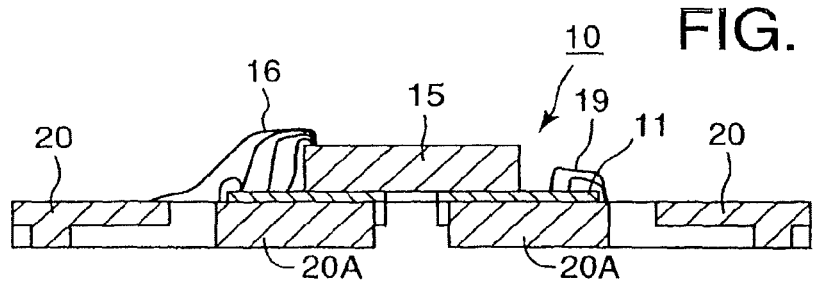
FIG. 11B is a cross sectional view of the wiring device, taken along a line A-A of FIG. 11A.

In FIGS. 11A and 11B (showing the fourth modification), a wiring device 10 for a semiconductor device is provided on divided die pads 20A. An area formed by outer sides of the divided die pads 20A is slightly larger than the area of the wiring device 10 shown in FIGS. 11A and 11B. A copper wiring layer 13 has power source terminal blocks 13F and ground terminal blocks 13G. Each of the power source terminal blocks 13F is electrically connected with a plurality of power source terminal electrodes 15A via first connection parts 16. The power source terminal electrodes 15A are provided on the semiconductor chip 15. Each of the ground terminal blocks 13G is electrically connected with a plurality of ground terminal electrodes 15A via other first connection parts 16. The ground terminal electrodes 15A are provided on the semiconductor chip 15. Each of the divided die pads 20A is configured as a ground block. The divided die pads 20A are connected with the ground terminal blocks 13G by means of the second connection parts 19, respectively.

In FIGS. 11A and 11B, each of the power source terminal blocks 13F is electrically connected with the power source terminal electrodes 15A, and each of the ground terminal blocks 13G is electrically connected with the ground terminal electrodes 15A. In addition, the divided die pads 20A are connected with the ground terminal blocks 13G by means of the second connection parts 19, respectively. The configuration shown in FIGS. 11A and 11B makes it possible to reduce the number of the second connection parts 19 that are included in the entire semiconductor device.

In FIGS. 9 to 11B (showing the second to fourth modifications), a die pad, which is composed of a copper wiring layer larger than the semiconductor chip 15, may be provided, and the semiconductor chip 15 may be provided above the die pad via an insulating film (or paste). In this case, the die pad composed of the copper wiring layer is configured as a ground layer, and the electrodes 15A provided on the semiconductor chip 15 are connected with the die pad by means of wires. This configuration makes it possible to reduce the number of terminals that are included in the semiconductor device.

Second Embodiment

Next, the second embodiment of the present invention is described below with reference to FIGS. 12, and 13(a) to 13(e).

Figure 12:
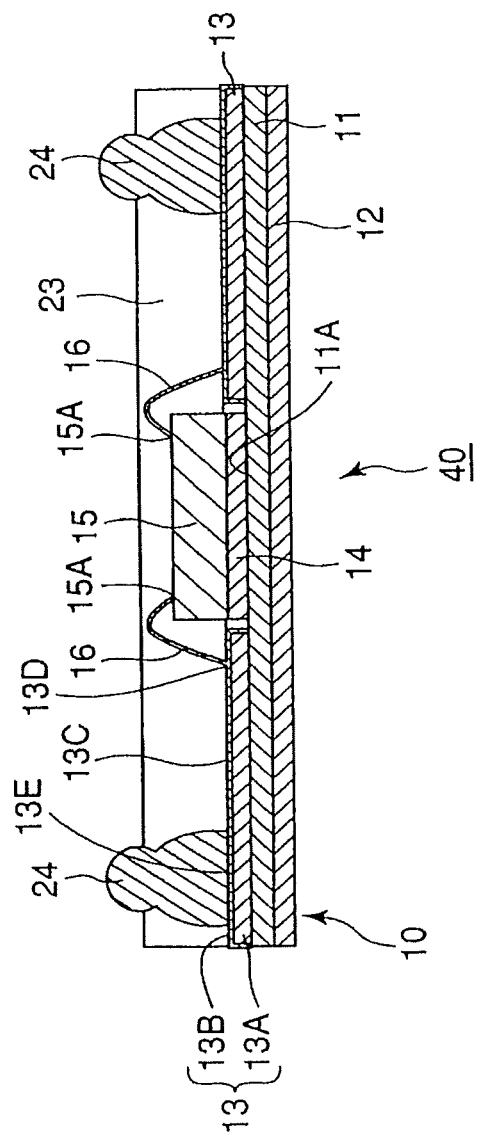
FIG. 12 is an outline cross sectional view of a semiconductor device according to a second embodiment of the present invention.

FIG. 12 is an outline cross sectional view of a package type semiconductor device according to the second embodiment of the present invention. FIGS. 13(a) to 13(e) are diagrams showing a method for manufacturing the package type semiconductor device. The semiconductor device according to the second embodiment shown in FIGS. 12 and 13(a) to 13(e) has second connection parts 24. A part of each of the second connection parts 24 protrudes from the resin seal member. This configuration is different from the first embodiment, and other configurations are substantially the same as those in the first embodiment. In FIGS. 12 and 13(a) to 13(e), the same elements as those in the first embodiment shown in FIGS. 1 to 11B are denoted by the same reference numerals, and detail description thereof is omitted.

As shown in FIG. 12, the package type semiconductor device 40 according to the present embodiment includes the aforementioned wiring device 10 (for a semiconductor device) and the semiconductor chip 15. The semiconductor chip 15 is placed above the semiconductor chip support portion 11A of the wiring device 10 via the adhesive layer 14 and has the plurality of electrodes 15A.

The electrodes 15A provided on the semiconductor chip 15 are connected with the first terminals 13D of the copper wiring layer 13 by means of the first connection parts 16 composed of the gold bonding wires, respectively.

The second connection parts 24 are provided on the respective second terminals 13E of the copper wiring layer 13. The second connection parts 24 are composed of solder connection parts and connected with external parts. As shown in FIG. 12, each of the second connection parts 24 is formed by laminating two solder balls. The structures of the second connection parts 24, however, are not limited to the above-mentioned structures as long as the height of each of the second connection parts 24 is equal to or larger than a certain value.

The copper wiring layer 13, the semiconductor chip 15, and the first connection parts 16 are resin-sealed by the resin seal member 23. The part of each of the second connection parts 24 protrudes from the resin seal member 23. The part of each of the second connection parts 24, which protrudes from the resin seal member 23, is designed to be electrically connected with a conductive member of an external device, for example. In this case, the semiconductor chip 15 can be reliably electrically connected with the external device.

The metal substrate 12 may be made of one or more of metals. It is most preferable that the metal substrate 12 be made of stainless. When the metal substrate 12 is made of stainless, the metal substrate 12 has higher rigidity than that of a substrate made of another metal. Thus, the thickness of the metal substrate 12 made of stainless can be smaller than that of the substrate made of the other metal. In addition, heat emitted by the semiconductor chip 15 is transferred to the metal substrate 12 and then released from the back surface of the metal substrate 12.

Next, a method for manufacturing the package type semiconductor device 40 shown in FIG. 12 is described below with reference to FIGS. 13(a) to 13(e).

Figure 13:
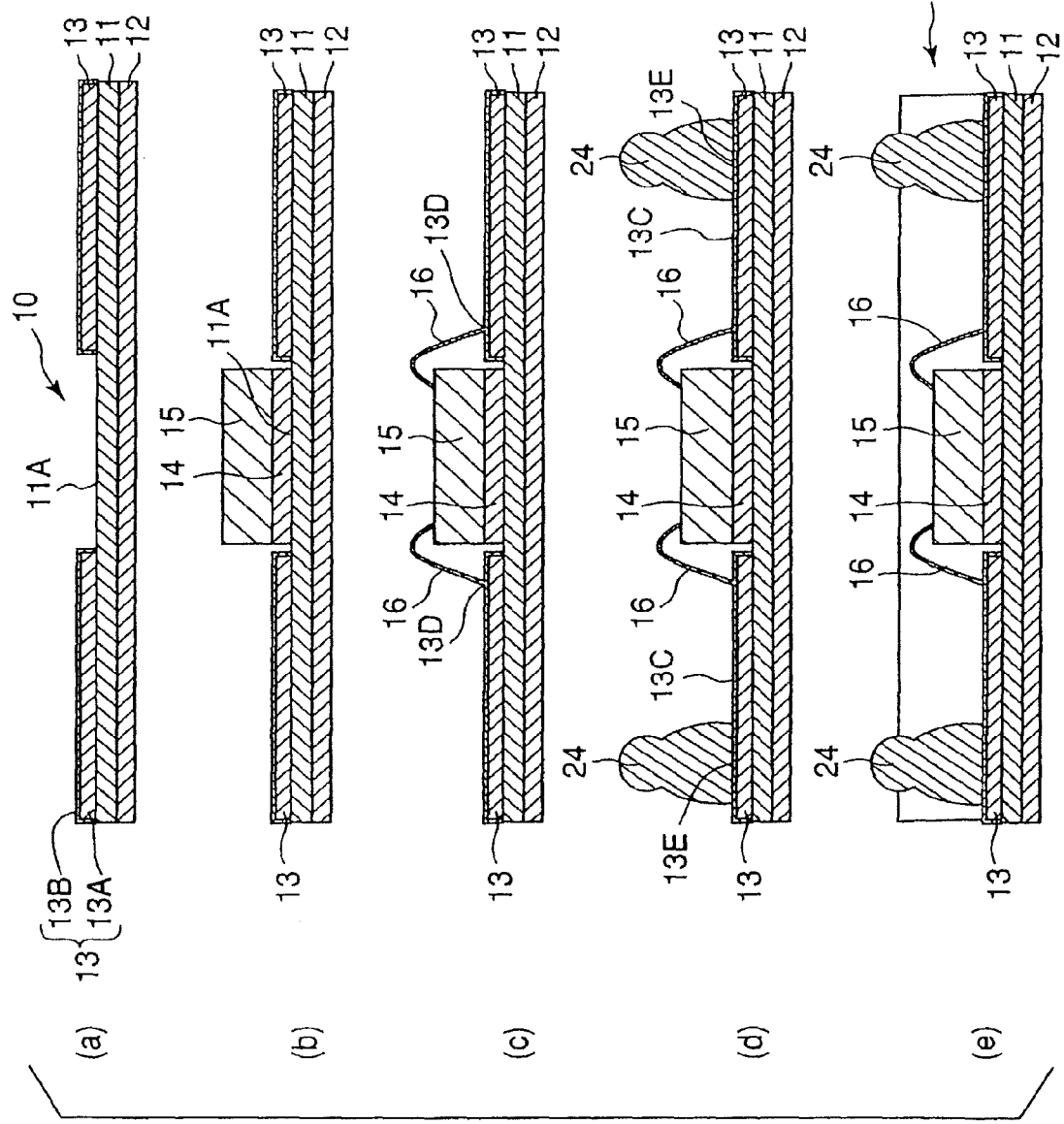
FIGS. 13(a) to 13(e) are diagrams showing a method for manufacturing a package type semiconductor device.

First, the wiring device 10 for a semiconductor device is formed according to the process shown in FIGS. 6(a) to 6(d), as shown in FIG. 13(a). Next, the semiconductor chip 15 is placed above the semiconductor chip support portion 11A of the wiring device 10 via the adhesive layer 14 and thereby fixed to the semiconductor chip support portion 11A as shown in FIG. 13(b). Next, the electrodes 15A provided on the semiconductor chip 15 are connected with the first terminals 13D of the copper wiring layer 13 by means of the first connection parts 16 composed of the bonding wires, respectively, as shown in FIG. 13(c).

Next, the second connection parts 24 (solder balls) connected with external parts are formed on the second terminals 13E of the copper wiring layer 13, respectively, as shown in FIG. 13(d). After that, the copper wiring layer 13, the semiconductor chip 15, and the first connection parts 16 are resin-sealed by the resin seal member 23. In this way, the semiconductor device 40 shown in FIG. 12 is completed as shown in FIG. 13(e).

According to the present embodiment, the semiconductor chip 15, which is smaller than the conventional semiconductor chips, can be connected with an external device. Specifically, according to the present embodiment, the electrodes 15A provided on the semiconductor chip 15 are connected with the first terminals 13D of the copper wiring layer 13 by means of the first connection parts 16, respectively, while the second connection parts 24 connected with external parts and composed of the solder connection parts are provided on the second terminals 13E of the copper wiring layer 13, respectively. This configuration makes it possible to reliably connect the semiconductor chip 15 with an external device even when pitches between conductive members of the external device are relatively large and pitches between the electrodes 15A provided on the semiconductor chip 15 are relatively small (e.g., 40 µm).

According to the present embodiment, since the copper wiring layer 13 is provided between the first connection parts 16 and the second connection parts 24, the cost of manufacturing the semiconductor device 40 is lower than the cost of manufacturing a semiconductor device in which the electrodes 15A provided on the semiconductor chip 15 are directly connected with the second connection parts 24 by means of gold bonding wires.

According to the present embodiment, since the metal substrate 12 is made of stainless, the metal substrate 12 has higher rigidity than those of conventional substrates made of polyimide and can be more easily handled than the conventional substrates. In addition, the thickness of the metal substrate 12 can be smaller than those of the conventional substrates. Furthermore, the heat emitted by the semiconductor chip 15 is transferred to the metal substrate 12 and then released from the back surface of the metal substrate 12.

The semiconductor device 40 shown in FIG. 12 can be cut and separated from each other by a dicer cut from the state where the multiple semiconductor devices 40 are formed (not shown). However, it may be difficult to cut the semiconductor devices 40 and separate them from each other by means of the dicer cut since the metal substrate 12 is made of stainless. In this case, a dicer cut line(s), which is wider than the width of a blade of the dicer cut, may be formed on the metal substrate 12 before the semiconductor devices are cut and separated from each other in order to improve the cutting efficiency.

In the present embodiment, the semiconductor chip support portion 11A may not be provided on the side of the copper wiring layer 13 with respect to the insulating layer 11 and may be provided on the copper wiring layer 13. In this case, the semiconductor chip 15 is placed above the semiconductor chip support portion 11A via an insulating film (or paste).

Third Embodiment

Figure 16:
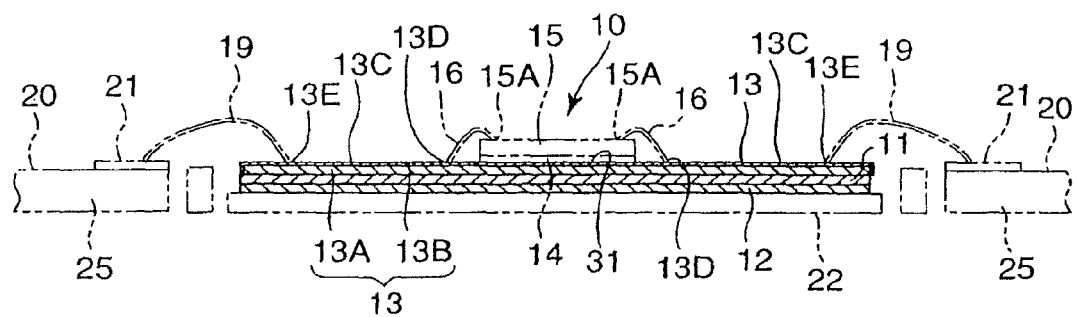
FIG. 16 is an outline cross sectional view of a wiring device for a semiconductor device according to a third embodiment of the present invention.
Figure 17:
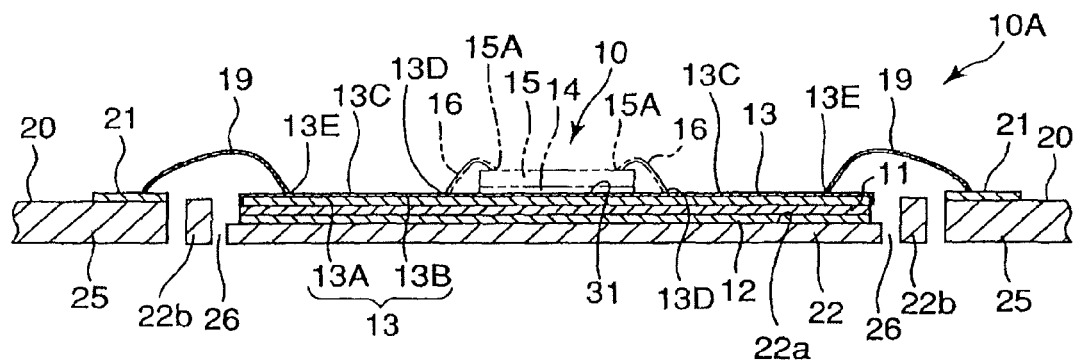
FIG. 17 is an outline cross sectional view of a composite wiring device for a semiconductor device according to the third embodiment of the present invention.
Figure 18:
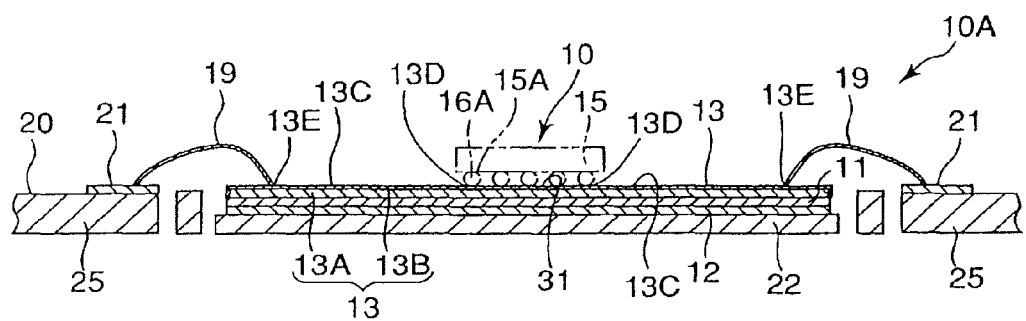
FIG. 18 is an outline cross sectional view of a modification of the wiring device for a semiconductor device according to the third embodiment of the present invention.
Figure 19:
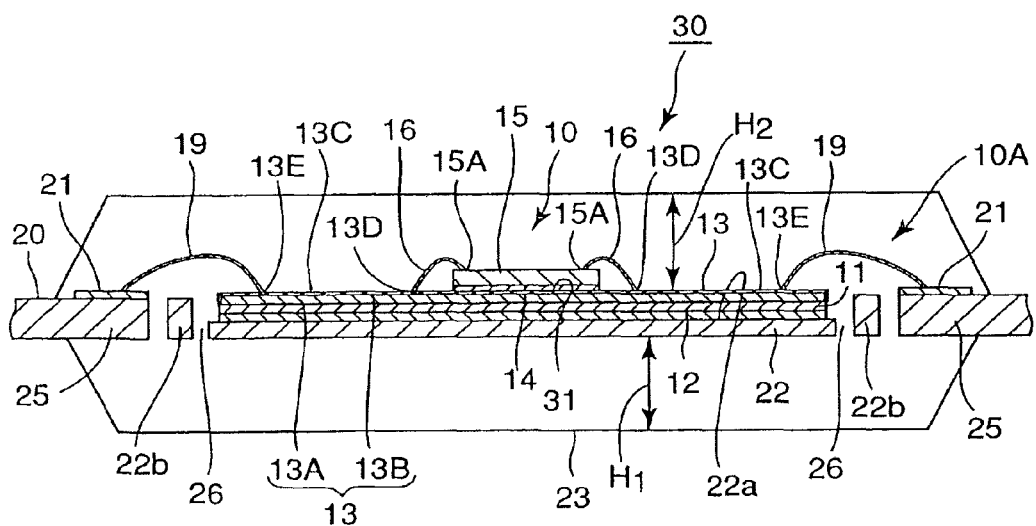
FIG. 19 is an outline cross sectional view of a semiconductor device according to the third embodiment.
Figure 20:
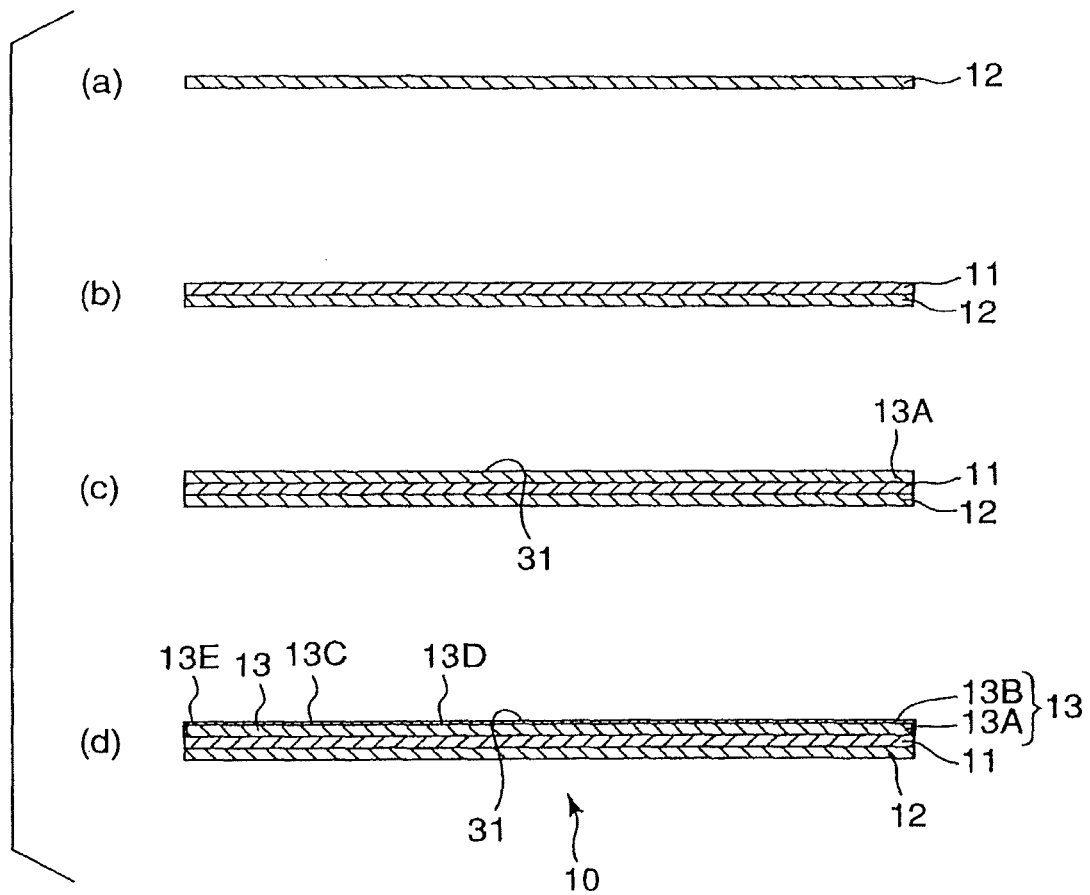
FIGS. 20(a) to 20(d) are diagrams showing a method for manufacturing the wiring device for a semiconductor device according to the third embodiment.
Figure 21:
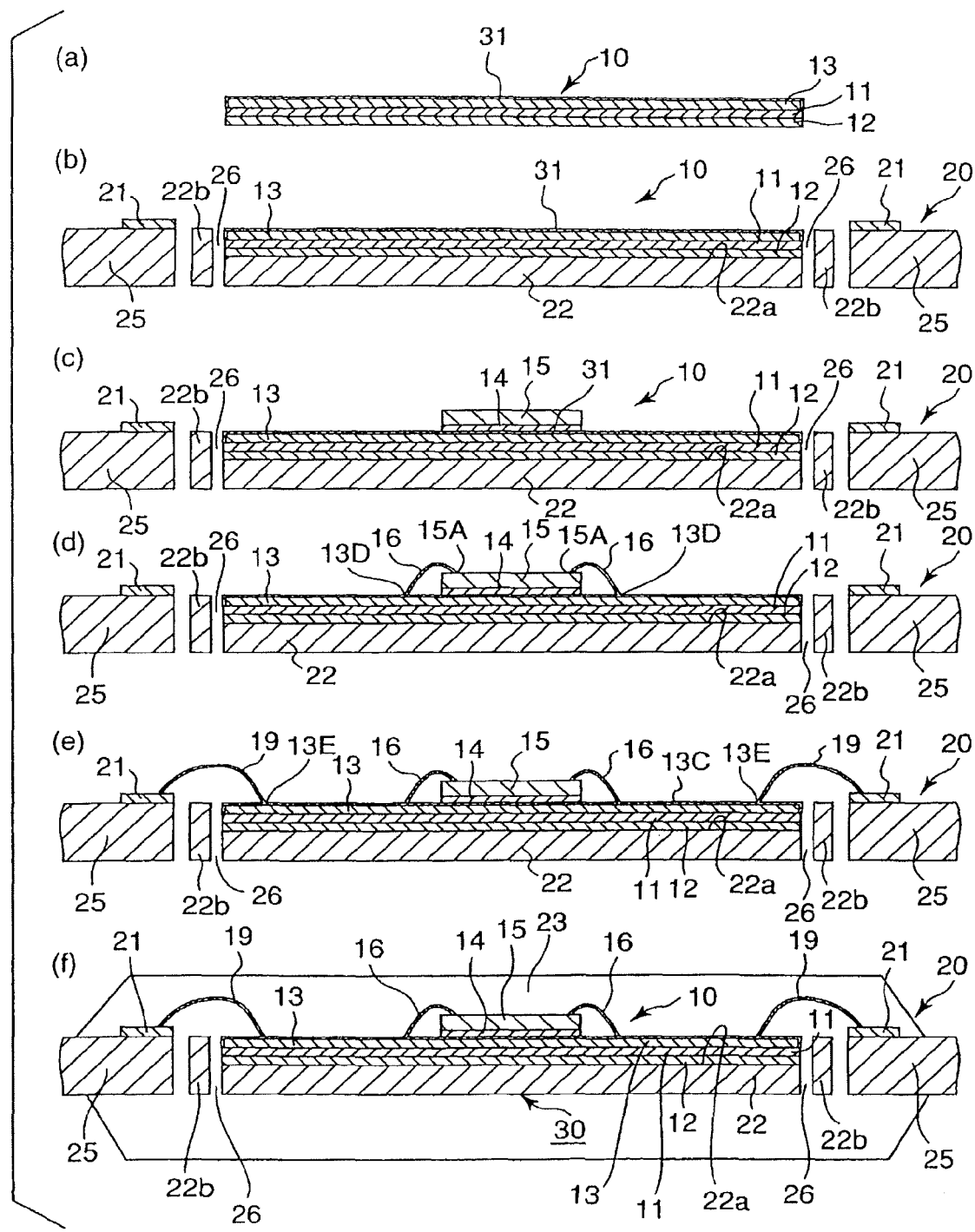
FIGS. 21(a) to 21(f) are diagrams showing a method for manufacturing the semiconductor device according to the third embodiment.

Next, the third embodiment of the present invention is described below with reference to FIGS. 16 to 21(f). FIG. 16 is an outline cross sectional view of a wiring device for a semiconductor device according to the third embodiment of the present invention. FIG. 17 is an outline cross sectional view of a composite wiring device for a semiconductor device according to the third embodiment of the present invention. FIG. 18 is an outline cross sectional view of a modification of the wiring device for a semiconductor device according to the third embodiment of the present invention. FIG. 19 is an outline cross sectional view of a semiconductor device according to the third embodiment of the present invention. FIGS. 20(a) to 20(d) are diagrams showing a method for manufacturing the wiring device for a semiconductor device according to the third embodiment of the present invention. FIGS. 21(a) to 21(f) are diagrams showing a method for manufacturing the semiconductor device according to the third embodiment of the present invention. In FIGS. 16 to 21(f), the same elements as those in the first embodiment shown in FIGS. 1 to 11B are denoted by the same reference numerals.

First, an outline of the wiring device for a semiconductor device according to the third embodiment is described below with reference to FIG. 16. In FIG. 16, parts other than the wiring device for a semiconductor device are indicated by imaginary lines (alternate long and two short dashes lines) for the sake of simplicity.

The wiring device 10 for a semiconductor device (shown in FIG. 16) according to the present embodiment is of wire connection type. As shown in FIG. 16, the wiring device 10 for a semiconductor device includes an insulating layer 11, a metal substrate 12 and a copper wiring layer 13. The insulating layer 11 is made of polyimide, for example. The metal substrate 12 is provided on one side of the insulating layer 11, while the copper wiring layer 13 is provided on another side of the insulating layer 11. The copper wiring layer 13 includes a plurality of first terminals 13D, a plurality of second terminals 13E and a plurality of wiring portions 13C. The first terminals 13D are electrically connected with the electrodes 15A provided on the semiconductor chip 15, respectively. The second terminals 13E are electrically connected with the inner leads 21 (external wiring devices), respectively. The wiring portions 13C electrically connect the first terminals 13D with the second terminals 13E, respectively.

The metal substrate 12 may be made of one or more of metals. It is most preferable that the metal substrate 12 be made of stainless. When the metal substrate 12 is made of stainless, the metal substrate 12 has higher rigidity than that of a substrate made of another metal. Thus, the thickness of the metal substrate 12 made of stainless can be reduced compared with the thickness of the substrate made of the other metal.

A semiconductor chip support portion 31 is provided on the copper wiring layer 13 to ensure that the semiconductor chip 15 having the plurality of electrodes 15A provided along the circumference thereof can be placed above the semiconductor chip support portion 31. In this case, the semiconductor chip 15 is placed above the semiconductor chip support portion 31 via the adhesive layer 14 and thereby fixed to the semiconductor chip support portion 31. The electrodes 15A provided on the semiconductor chip 15 are electrically connected with the first terminals 13D of the copper wiring layer 13 by means of the first connection parts 16 composed of the gold bonding wires, respectively.

The second terminals 13E of the copper wiring layer 13 are electrically connected with the inner leads 21 of the lead frame 20 by means of the second connection parts 19, respectively.

Next, an outline of the composite wiring device for a semiconductor device according to the present embodiment is described below with reference to FIG. 17. In FIG. 17, parts other than the composite wiring device for a semiconductor device are indicated by imaginary lines (alternate long and two short dashes lines) for the sake of simplicity.

As shown in FIG. 17, the composite wiring device 10A for a semiconductor device includes the wiring device 10 shown in FIG. 16, the lead frame 20 and the second connection parts 19. The lead frame 20 is electrically connected with the wiring device 10. The second connection parts 19 electrically connect the second terminals 13E of the copper wiring layer 13 with the lead frame 20. The composite wiring device 10A electrically connects the electrodes 15A provided on the semiconductor chip 15 with an external wiring substrate (not shown).

The lead frame 20 has the die pad 22 and leads 25. The wiring device 10 is located on the die pad 22. The leads 25 are located on an outer side of the die pad 22. Inner leads 21 (external wiring devices) made of plated silver or palladium are provided on the leads 25.

The die pad 22 has a central area 22a and a circumferential area 22b. The semiconductor chip 15 is placed above the central area 22a of the die pad 22. The circumferential area 22b is located on the outer side of the central area 22a and has a thickness that is substantially the same as those of the leads 25. A slit hole 26 is provided between the central area 22a and the circumferential area 22b of the die pad 22. The slit hole 26 is adapted to discharge, to the outside, a gas generated by an adhesive that bonds the wiring device 10 to the lead frame 20, as described later.

At least the central area 22a of the die pad 22 is formed by a half etching method, or the like to ensure that the central are 22a has a small thickness. That is, the thickness of the central area 22a is smaller than those of the leads 25 and that of the circumferential area 22b. It is, therefore, possible that the semiconductor device 30 having the semiconductor chip 15 has a small thickness.

The second connection parts 19 are composed of gold bonding wires. The second connection parts 19 have one ends connected with the respective second terminals 13E and other ends connected with the respective inner leads 21 of the lead frame 20.

FIG. 18 shows a modification of the third embodiment. As shown in FIG. 18, the electrodes 15A provided on the semiconductor chip 15 may be located on the side of the copper wiring layer 13. In addition, the electrodes 15A provided on the semiconductor chip 15 may be connected with the first terminals 13D of the copper wiring layer 13 by means of first connection parts 16A composed of bumps or solder balls, respectively, (this connection is called a flip chip connection). In this case, the manufacturing cost can be reduced since a gold bonding wire is not used as the first connection part.

Next, an outline of a semiconductor device having the wiring device shown in FIG. 16 and the composite wiring device shown in FIG. 17 is described below with reference to FIG. 19.

The semiconductor device 30 shown in FIG. 19 has the wiring device 10 shown in FIG. 16 and the composite wiring device 10A shown in FIG. 17. Specifically, the semiconductor device 30 shown in FIG. 19 has the lead frame 20, the wiring device 10 and the semiconductor chip 15. The lead frame 20 shown in FIG. 19 has the die pad 22. The wiring device 10 shown in FIG. 19 is placed on the die pad 22 of the lead frame 20 and electrically connected with the lead frame 20. The semiconductor chip 15 shown in FIG. 19 is placed above the semiconductor chip support portion 31 of the wiring device 10 and has the electrodes 15A.

The plurality of conductive inner leads 21 are provided on an upper surface of the lead frame 20. The second connection parts 19 composed of the bonding wires electrically connect the second terminals 13E of the copper wiring layer 13 with the inner leads 21, respectively. The electrodes 15A provided on the semiconductor chip 15 are electrically connected with the first terminals 13D by means of the first connection parts 16 composed of the bonding wires. The semiconductor chip 15, the copper wiring layer 13, a part of the lead frame 20, the first connection parts 16 and the second connection parts 19 are resin-sealed by the resin seal member 23 under the condition that parts of the leads 25 of the lead frame 20 are exposed to the outside of the resin seal member 23.

Since the configuration of the die pad 22 is described above with reference to FIG. 17, description thereof is not made in the present embodiment.

A distance $H_1$ between a bottom surface of the die pad 22 and a lower surface of the resin seal member 23 is substantially the same as a distance $H_2$ between an upper surface of the wiring device 10 for a semiconductor device and an upper surface of the resin seal member 23. This configuration makes it possible to prevent the semiconductor device 30 from being bent and cracked during a moisture absorption test (reflow test) (the details are described later).

Next, effects of the aforementioned configurations according to the present embodiment are described below.

A method for forming the wiring device 10 (shown in FIG. 16) for a semiconductor device according to the present embodiment is described below with reference to FIGS. 20(a) to 20(d).

First, the metal substrate 12 made of stainless is prepared as shown in FIG. 20(a). Then, the insulating layer 11 made of polyimide is formed on the metal substrate 12 as shown in FIG. 20(b).

Then, the copper layer 13A is formed on the insulating layer 11 by an additive method or an etching method as shown in FIG. 20(c). The plating layer 13B composed of the nickel plating layer and the gold plating layer is formed on the copper layer 13A by electrolytic plating or electroless plating as shown in FIG. 20(d). The copper layer 13A and the plating layer 13B constitute the copper wiring layer 13. The first terminals 13D, the second terminals 13E and the wiring portions 13C are formed in the process for forming the plating layer 13B. In this way, the wiring device 10 for a semiconductor device and having the insulating layer 11, the metal substrate 12 and the copper wiring layer 13 is formed. The semiconductor chip support portion 31 is formed on the copper wiring layer 13.

Next, a method for manufacturing the semiconductor device (shown in FIG. 19) according to the present embodiment is described below with reference to FIGS. 21(a) to 21(f).

First, the wiring device 10 is formed according to the process shown in FIGS. 20(a) to 20(d), as shown in FIG. 21(a). Next, the lead frame 20 having the inner leads 21 and the die pad 22 is prepared, and the wiring device 10 is placed on the die pad 22 of the lead frame 20 as shown in FIG. 21(b). In this case, the wiring device 10 is bonded to the die pad 22 by means of an adhesive. Since the surface of the wiring device 10 is flat, the wiring device 10 can be uniformly pressurized against the surface of the die pad 22. This prevents a gap from being formed between the wiring device 10 and the die pad 22 after the bonding.

After that, the semiconductor chip 15 is placed above the semiconductor chip support portion 31 of the wiring device 10 for a semiconductor device via the adhesive layer 14 and thereby fixed to the semiconductor chip support portion 31 as shown in FIG. 21(c). The electrodes 15A provided on the semiconductor chip 15 are connected with the first terminals 13D of the copper wiring layer 13 by means of the first connection parts 16 composed of the bonding wires, respectively, as shown in FIG. 21(d).

Then, the second terminals 13E of the copper wiring layer 13 are connected with the inner leads 21 of the lead frame 20 by means of the second connection parts 19 composed of the bonding wires, respectively, as shown in FIG. 21(e). After that, the wiring device 10, the semiconductor chip 15, the first connection parts 16, the die pad 22, the second connection parts 19 and the inner leads 21 are resin-sealed by the resin seal member 23 under the condition that the part (outer lead part) of the lead frame 20 is exposed to the outside of the resin seal member 23. In this way, the semiconductor device 30 shown in FIG. 19 is completed as shown in FIG. 21(f).

During the process for resin-sealing the parts of the semiconductor device 30 by means of the resin seal member 23, the wiring device 10 for a semiconductor device and the die pad 22 are heated to a temperature of about 180° C. In this case, the adhesive bonding the wiring device 10 to the die pad 22 is also heated. Thus, an organic gas may be generated from the adhesive. In addition, water absorbed into the adhesive may be heated, and vapor may be generated. In the present embodiment, since the slit hole 26 is provided between the central area 22a and circumferential area 22b of the die pad 22, the gas (organic gas and/or vapor) generated from the adhesive passes through the slit hole 26 and is discharged to the outside of the semiconductor device 30 before the resin seal member 23 is solidified. Therefore, the gas does not remain in the resin seal member 23.

If the slit hole 26 is not provided, the resin seal member 23 is solidified under the condition that the gas (organic gas and/or vapor) remains in an area between the die pad 22 and the wiring device 10 or near the area. In this case, when the moisture absorption test (reflow test) is performed on the completed semiconductor device 30, a portion in which the gas remains may swell, and a crack may be generated in the portion. According to the present embodiment, the slit hole 26 is provided in the die pad 22, and the gas generated from the adhesive can be discharged through the slit hole 26 to the outside. Therefore, a crack is not generated in the semiconductor device 30 during the moisture absorption test (reflow test).

According to the present embodiment, the semiconductor chip 15, which is formed at a higher density than those of conventional semiconductor chips and is therefore smaller than the conventional semiconductor chips, can be placed above the lead frame 20. That is, the pitches between the inner leads 21 of the lead frame 20 are relatively large (e.g., 130 μm), while the pitches between the electrodes 15A provided on the semiconductor chip 15 are relatively small (e.g., 40 μm). Even in this case, the semiconductor chip 15 can be reliably connected with the inner leads 21 of the lead frame 20.

According to the present embodiment, since at least the thickness of the central area 22a (above which the semiconductor chip 15 is placed) of the die pad 22 is smaller than those of the leads 25, the semiconductor device 30 having a small thickness can be configured.

According to the present embodiment, the slit hole 26 is provided between the central area 22a and circumferential area 22b of the die pad 22, and the gas generated from the adhesive that bonds the wiring device 10 for a semiconductor device to the lead frame 20 passes through the slit hole 26 and is discharged to the outside of the semiconductor device 30. This configuration makes it possible to prevent a crack from being formed in the semiconductor device 30 during the moisture absorption test (reflow test).

According to the present embodiment, the distance between the bottom surface of the die pad 22 and the lower surface of the resin seal member 23 is substantially the same as the distance between an upper surface of the copper wiring layer 13 of the wiring device 10 for a semiconductor device and the upper surface of the resin seal member 23. An upper portion of the resin seal member 23 is located on the side of an upper surface of the semiconductor device 30, and a lower portion of the resin seal member 23 is located on the side of a lower surface of the semiconductor device 30. The upper portion of the resin seal member 23 has a volume that is substantially the same as that of the lower portion of the resin seal member 23. As a result, the upper portion of the resin seal member 23 and the lower portion of the resin seal member 23 expand by the same degree during the moisture absorption test (reflow test). This prevents the semiconductor device 30 from being bent and cracking.

According to the present embodiment, since the copper wiring layer 13 is provided between the first connection parts 16 and the second connection parts 18, the cost of manufacturing the semiconductor device 30 is lower than the cost of manufacturing a semiconductor device in which the electrodes 15A provided on the semiconductor chip 15 are directly connected with the inner leads 21 of the lead frame 20 by means of gold bonding wires.

According to the present embodiment, since the metal substrate 12 is made of stainless, the metal substrate 12 has higher rigidity than those of conventional substrates made of polyimide and can be more easily handled than the conventional substrates. In addition, the thickness of the metal substrate 12 can be smaller than those of the conventional substrates.

Fourth Embodiment

Next, the fourth embodiment of the present invention is described below with reference to FIGS. 22 to 25.

Figure 22:
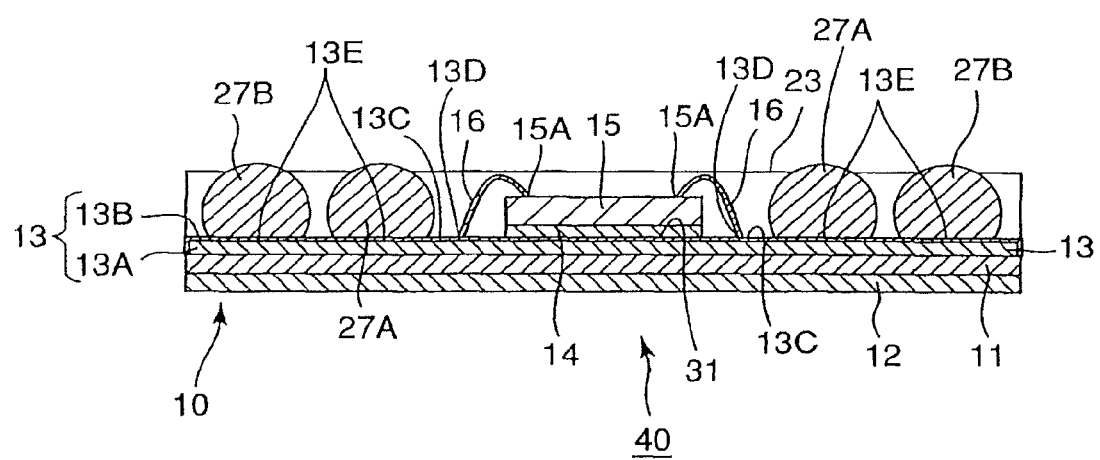
FIG. 22 is an outline cross sectional view of a semiconductor device according to a fourth embodiment of the present invention.
Figure 23:
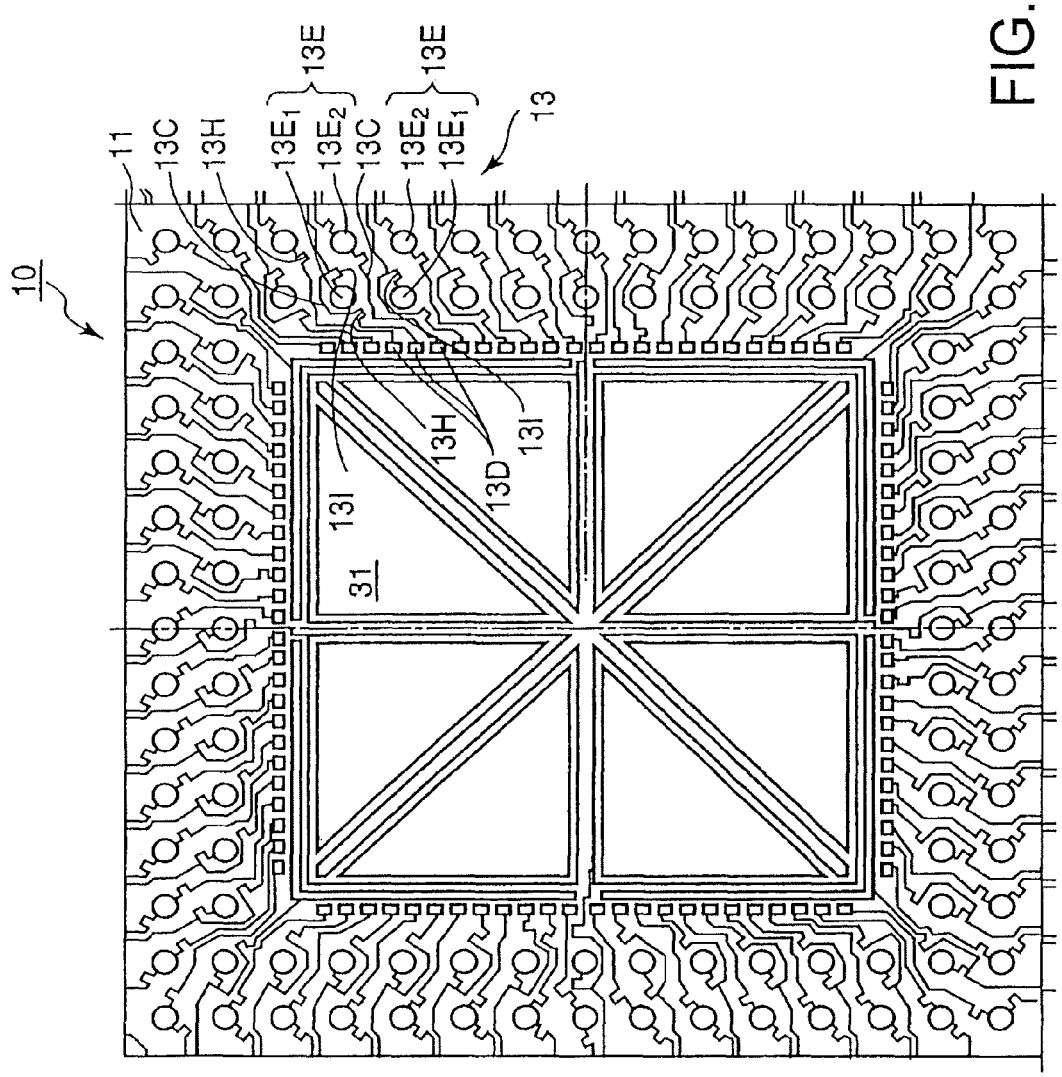
FIG. 23 is a plan view of a wiring device used in the semiconductor device according to the fourth embodiment.
Figure 24:
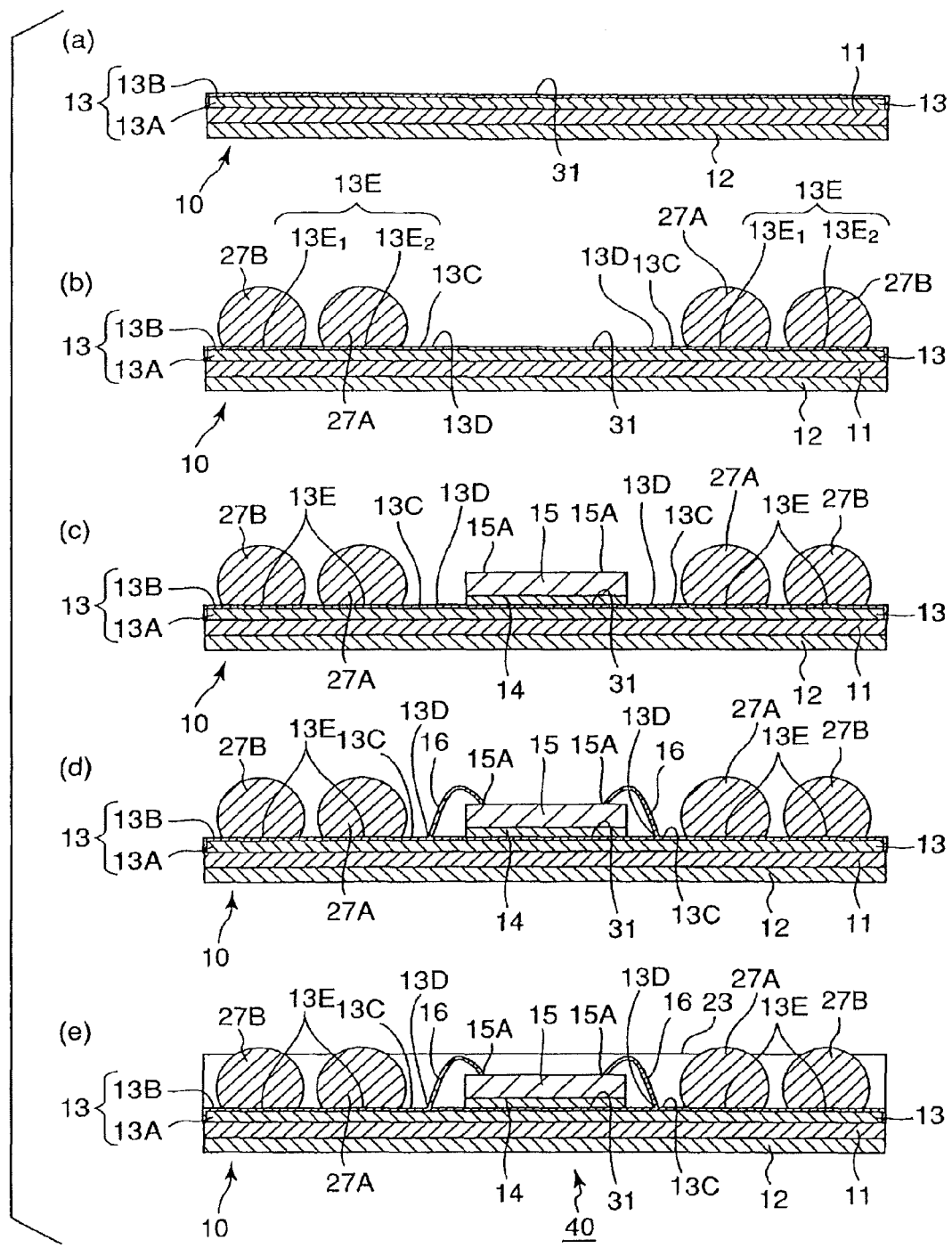
FIGS. 24(a) to 24(e) are diagrams showing a method for manufacturing the semiconductor device according to the fourth embodiment.
Figure 25:
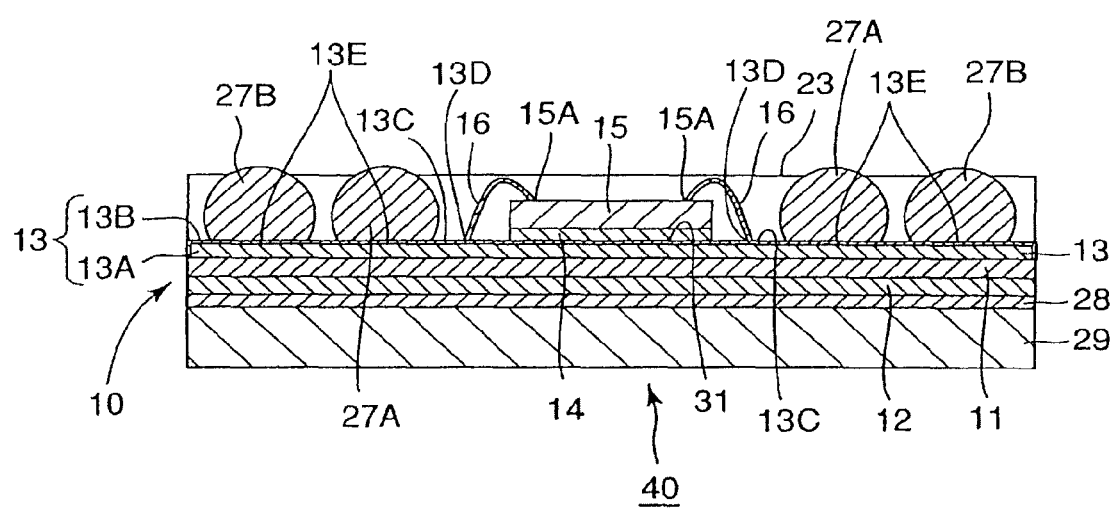
FIG. 25 is an outline cross sectional view of a modification of the semiconductor device according to the fourth embodiment.

FIG. 22 is an outline cross sectional view of a semiconductor device according to the fourth embodiment of the present invention. FIG. 23 is a plan view of a wiring device used for the semiconductor device according to the fourth embodiment of the present invention. FIGS. 24(a) to 24(e) are diagrams showing a method for manufacturing the semiconductor device according to the fourth embodiment of the present invention. FIG. 25 is an outline cross sectional view of a modification of the semiconductor device according to the fourth embodiment of the present invention. The fourth embodiment shown in FIGS. 22 to 25 is different from the second embodiment in the configurations of second connection parts 27A and 27B, the configuration of the copper wiring layer 13 and the configuration of the semiconductor chip support portion 31. Other configurations in the fourth embodiment are substantially the same as those in the second embodiment. In FIGS. 22 to 25, the same elements as those in the second embodiment shown in FIG. 12 and FIGS. 13(a) to 13(e) are denoted by the same reference numerals, and description thereof is omitted.

In FIG. 22, reference numeral 40 denotes the package type semiconductor device according to the fourth embodiment. The semiconductor device 40 shown in FIG. 22 includes the wiring device 10 and the semiconductor chip 15. The semiconductor chip 15 is placed above the semiconductor chip support portion 31 via the adhesive layer 14 and has the plurality of electrodes 15A. The semiconductor chip support portion 31 is located on the copper wiring layer 13 of the wiring device 10.

The wiring device 10 shown in FIGS. 22 and 23 includes the insulating layer 11, the metal substrate 12 and the copper wiring layer 13. The metal substrate 12 shown in FIG. 22 is made of stainless, for example. The copper wiring layer 13 includes a plurality of the first terminals 13D, a plurality of the second terminals 13E and a plurality of the wiring portions 13C. The first terminals 13D are electrically connected with the electrodes 15A provided on the semiconductor chip 15, respectively. The second terminals 13E are connected with external parts. The wiring portions 13C electrically connect the first terminals 13D with the second terminals 13E, respectively.

In addition, the electrodes 15A provided on the semiconductor chip 15 are connected with the first terminals 13D of the copper wiring layer 13 by means of the first connection parts 16 composed of the gold bonding wires, respectively.

The second connection parts 27A and 27B are provided on the second terminals 13E of the copper wiring layer 13, respectively. The second connection parts 27A and 27B are composed of solder connection parts (solder balls) and connected with external parts. The second connection parts 27A are located on the side of the semiconductor chip 15 (or located on the side of the first terminals 13D), while the second connection parts 27B are located on the opposite side of the semiconductor chip 15 (or located on the opposite side of the first terminals 13D) as shown in FIG. 22.

The copper wiring layer 13, the semiconductor chip 15 and the first connection parts 16 are resin-sealed by the resin seal member 23, while top portions of the second connection parts 27A and 27B are exposed to the outside of the resin seal member 23. The top portions of the second connection parts 27A and 27B, which are exposed to the outside of the resin seal member 23, are designed to be electrically connected with conductive members of an external device, for example. Thus, the semiconductor chip 15 can be electrically connected with the external device.

The metal substrate 12 may be made of one or more of metals. It is most preferable that the metal substrate 12 be made of stainless. When the metal substrate 12 is made of stainless, the metal substrate 12 has higher rigidity than that of a metal substrate made of another metal. Thus, the thickness of the metal substrate 12 made of stainless can be smaller than that of the metal substrate made of the other metal. In addition, heat emitted by the semiconductor chip 15 is transferred to the metal substrate 12 and then released from the back surface of the metal substrate 12.

FIG. 23 is a plan view of the wiring device 10 used for the semiconductor device 40 according to the present embodiment. As shown in FIG. 23, the plurality of the second terminals 13E of the copper wiring layer 13 have respective circular shapes when viewed from the top of the wiring device 10. In FIG. 23, the plurality of second terminals 13E, which are located on the sides of the plurality of first terminals 13D, are denoted by reference numeral $13E_1$, while the second terminals 13E, which are located on the opposite sides of the first terminals 13D, are denoted by reference numeral $13E_2$.

As shown in FIG. 23, each of the wiring portions 13C of the copper wiring layer 13 has a crank portion 13H in the middle thereof. Parts (surrounding parts 13I) of the wiring portions 13C surround the second terminals $13E_1$, respectively. The wiring portions 13C respectively connect the first terminals 13D with the second terminals $13E_1$ (which are located on the side of the first terminals 13D).

The following effect can be obtained by the crank portions 13H and the surrounding parts 13I. That is, when the second connection parts 27A and 27B are formed on the second terminals $13E_1$ and $13E_2$ with solder, respectively, molten solder flows along the wiring portions 13C. In this case, the flowing molten solder is moved away from the first terminals 13D and prevented from reaching the first terminals 13D by the crank portions 13H and the surrounding parts 13I. If the crank portions 13H and the surrounding parts 13I are not provided, the flowing molten solder may reach the first terminals 13D. In this case, a failure may occur, in which the first connection part(s) 16 (bonding wire(s)) cannot be connected with the first terminal(s) 13D.

As shown in the modification of the semiconductor device according to the fourth embodiment illustrated in FIG. 25, a radiation plate 29 may be provided under a back surface of the copper wiring layer 13 via a radiation plate adhesive layer 28. In this case, the radiation plate adhesive layer 28 is composed of a die attachment film, and the radiation plate 29 is made of copper, for example. This configuration makes it possible to discharge heat emitted by the semiconductor chip 15 through the radiation plate 29 and thereby improve a heat radiation characteristic of the semiconductor device 40.

Next, a method for manufacturing the package type semiconductor device 40 shown in FIG. 22 is described below with reference to FIGS. 24(a) to 24(e).

First, the wiring device 10 for a semiconductor device is formed according to the process shown in FIGS. 20(a) to 20(d), as shown in FIG. 24(a). Then, the second connection parts 27A and 27B (solder balls) connected with external parts are formed on the second terminals 13E (second terminals $13E_1$ and second terminals $13E_2$) of the copper wiring layer 13, respectively, as shown in FIG. 24(b). In this case, the parts (surrounding parts 13I) of the wiring portions 13C surround the second terminals $13E_1$, respectively, as shown in FIG. 23. Thus, when the second connection parts 27A and 27B are formed, and even if the solder flows along the wiring portions 13C, the solder does not reach the first terminals 13D.

Next, the semiconductor chip 15 is placed above the semiconductor chip support portion 31 of the wiring device 10 via the adhesive layer 14 and thereby fixed to the semiconductor chip support portion 31 as shown in FIG. 24(c). Then, the electrodes 15A provided on the semiconductor chip 15 are connected with the first terminals 13D of the copper wiring layer 13 by means of the first connection parts 16 composed of the bonding wires, respectively, as shown in FIG. 24(d).

After that, the copper wiring layer 13, the semiconductor chip 15 and the first connection parts 16 are resin-sealed by the resin seal member 23. In this way, the semiconductor device 40 shown in FIG. 22 is completed as shown in FIG. 24(e).

According to the present embodiment, the semiconductor chip 15, which is smaller than the conventional semiconductor chips, can be connected with an external device. Specifically, according to the present embodiment, the electrodes 15A provided on the semiconductor chip 15 are connected with the first terminals 13D of the copper wiring layer 13 by means of the first connection parts 16, respectively. In addition, the second connection parts 27A and 27B connected with external parts and composed of the solder balls are provided on the second terminals 13E of the copper wiring layer 13, respectively. Thus, even when pitches between conductive members of the external device are relatively large and pitches between the electrodes 15A provided on the semiconductor chip 15 are relatively small (e.g., 40 µm), the semiconductor chip 15 can be reliably connected with the external device.

According to the present embodiment, since the copper wiring layer 13 is provided between the first connection parts 16 and the second connection parts 27A and 27B, the cost of manufacturing the semiconductor device 40 is lower than the cost of manufacturing a semiconductor device in which the electrodes 15A provided on the semiconductor chip 15 are directly connected with the second connection parts 27A and 27B by means of gold bonding wires.

According to the present embodiment, since the metal substrate 12 is made of stainless, the metal substrate 12 has higher rigidity than those of conventional substrates made of polyimide and can be more easily handled than the conventional substrates. In addition, the thickness of the metal substrate 12 can be smaller than those of conventional substrates. Furthermore, heat emitted by the semiconductor chip 15 is transferred to the metal substrate 12 and then released from the back surface of the metal substrate 12.

What is claimed is:

1. A resin-sealed semiconductor device comprising:
a wiring device including an insulating layer, a metal substrate, a copper wiring layer and a semiconductor chip support portion, the metal substrate being provided on one side of the insulating layer and being made of stainless steel, the semiconductor chip support portion being provided on the side of the copper wiring layer with respect to the insulating layer or provided on the copper wiring layer, the copper wiring layer being provided on another side of the insulating layer and including a first terminal, a second terminal and a wiring portion, the first terminal being connected with an electrode provided on a semiconductor chip, the second terminal being connected with an external wiring device, the wiring portion connecting the first terminal with the second terminal; and
a semiconductor chip placed above the semiconductor chip support portion of the wiring device via an adhesive layer and having an electrode;
wherein the electrode provided on the semiconductor chip is electrically connected with the first terminal by means of a first connection part,
a second connection part connected with an external part is provided on the second terminal of the copper wiring layer,
the copper wiring layer, the semiconductor chip and the first connection part are resin-sealed by a resin seal member under the condition that a part of the second connection part is exposed to the outside of the resin seal member, and
a widest portion of the second connection part is embedded in the resin seal member.

2. The resin-sealed semiconductor device according to claim 1, wherein
the second connection part is made of solder.

3. A resin-sealed semiconductor device comprising:
a wiring device including an insulating layer, a metal substrate, a copper wiring layer and a semiconductor chip support portion, the metal substrate being provided on one side of the insulating layer and being made of stainless steel, the semiconductor chip support portion being provided on the copper wiring layer, the copper wiring layer being provided on another side of the insulating layer and including a first terminal, a second terminal and a wiring portion, the first terminal being connected with an electrode provided on a semiconductor chip, the second terminal being connected with an external wiring device, the wiring portion connecting the first terminal with the second terminal; and
a semiconductor chip placed above the semiconductor chip support portion of the wiring device via an adhesive layer and having an electrode;
wherein the electrode provided on the semiconductor chip is electrically connected with the first terminal by means of a first connection part,
a second connection part connected with an external part is provided on the second terminal of the copper wiring layer,
the copper wiring layer, the semiconductor chip and the first connection part are resin-sealed by a resin seal member under the condition that a part of the second connection part is exposed to the outside of the resin seal member,
the second connection part is made of solder,
the wiring portion connecting the first connection part with the second connection part surrounds the second terminal, and
the wiring portion has a crank portion in the middle of the wiring portion and a surrounding part surrounding the second terminal.

* * * * *